US010658415B2

(12) United States Patent
Ishida et al.

(10) Patent No.: US 10,658,415 B2
(45) Date of Patent: May 19, 2020

(54) LIGHT DETECTION DEVICE

(71) Applicant: HAMAMATSU PHOTONICS K.K., Hamamatsu-shi, Shizuoka (JP)

(72) Inventors: Atsushi Ishida, Hamamatsu (JP); Noburo Hosokawa, Hamamatsu (JP); Terumasa Nagano, Hamamatsu (JP); Takashi Baba, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 16/315,708

(22) PCT Filed: Jul. 26, 2017

(86) PCT No.: PCT/JP2017/027057
§ 371 (c)(1),
(2) Date: Jan. 7, 2019

(87) PCT Pub. No.: WO2018/021413
PCT Pub. Date: Feb. 1, 2018

(65) Prior Publication Data
US 2019/0371849 A1 Dec. 5, 2019

(30) Foreign Application Priority Data

Jul. 27, 2016 (JP) .................. 2016-147378

(51) Int. Cl.
*H01L 27/146* (2006.01)
*H01L 31/107* (2006.01)
*H01L 31/0224* (2006.01)

(52) U.S. Cl.
CPC .......... *H01L 27/14636* (2013.01); *H01L 31/022416* (2013.01); *H01L 31/107* (2013.01)

(58) Field of Classification Search
CPC .............. H01L 31/107; H01L 31/022416
See application file for complete search history.

(56) References Cited

U.S. PATENT DOCUMENTS

2009/0184384 A1 7/2009 Sanfilippo et al.
2010/0193954 A1 8/2010 Liu et al.
(Continued)

FOREIGN PATENT DOCUMENTS

EP       2463896 A1    6/2012
JP    2009-65200 A    3/2009
(Continued)

OTHER PUBLICATIONS

International Preliminary Report on Patentability dated Feb. 7, 2019 for PCT/JP2017/027057.

*Primary Examiner* — Farun Lu
(74) *Attorney, Agent, or Firm* — Faegre Drinder Biddle & Reath LLP

(57) ABSTRACT

A photodetecting device includes a semiconductor substrate, a plurality of avalanche photodiodes each including a light receiving region disposed at a first principal surface side of the semiconductor substrate, the avalanche photodiodes being arranged two-dimensionally at the semiconductor substrate, and a through-electrode electrically connected to a corresponding light receiving region. The through-electrode is provided in a through-hole penetrating through the semiconductor substrate in an area where the plurality of avalanche photodiodes are arranged two-dimensionally. At the first principal surface side of the semiconductor substrate, a groove surrounding the through-hole is formed between the through-hole and the light receiving region adjacent to the through-hole. A first distance between an edge of the groove and an edge of the through-hole surrounded by the groove is longer than a second distance between the edge of the groove and an edge of the light receiving region adjacent to the through-hole surrounded by the groove.

8 Claims, 11 Drawing Sheets

(56) References Cited

U.S. PATENT DOCUMENTS

| | | | |
|---|---|---|---|
| 2011/0272561 A1 | 11/2011 | Sanfilippo et al. | |
| 2013/0249011 A1 | 9/2013 | Choi et al. | |
| 2014/0210035 A1 | 7/2014 | Park et al. | |
| 2014/0263975 A1* | 9/2014 | Nagano | H01L 27/144 250/208.2 |
| 2014/0291486 A1 | 10/2014 | Nagano et al. | |
| 2017/0031010 A1* | 2/2017 | Suzuki | G01S 7/4865 |

FOREIGN PATENT DOCUMENTS

| | | |
|---|---|---|
| JP | 2010-153603 A | 7/2010 |
| JP | 2012-124484 A | 6/2012 |
| JP | 2015-61041 A | 3/2015 |
| JP | 2016-29738 A | 3/2016 |
| WO | WO-2015/025723 A1 | 2/2015 |

* cited by examiner

LIGHT DETECTION DEVICE

TECHNICAL FIELD

The present invention relates to a photodetecting device.

BACKGROUND ART

Known photodetecting devices include a semiconductor substrate including a first principal surface and a second principal surface that oppose each other (see, for example, Patent Literature 1). The photodetecting device described in Patent Literature 1 includes a plurality of avalanche photodiodes operating in Geiger mode and through-electrodes electrically connected to the corresponding avalanche photodiodes. The plurality of avalanche photodiodes are two-dimensionally arranged on the semiconductor substrate. Each avalanche photodiode includes a light receiving region disposed at the first principal surface side of the semiconductor substrate. The through-electrode is disposed in a through-hole penetrating through the semiconductor substrate in the thickness direction.

CITATION LIST

Patent Literature

Patent Literature 1: Japanese Unexamined Patent Publication No. 2015-61041

SUMMARY OF INVENTION

Technical Problem

The object of an aspect of the present invention is to provide a photodetecting device in which the aperture ratio is ensured, and an inflow of a surface leakage electric current to the avalanche photodiode is reduced, and structural defects are less likely to occur around the through-hole in the semiconductor substrate.

Solution to Problem

As a result of researches and studies, the present inventors have newly found the following facts.

When a photodetecting device includes a plurality of avalanche photodiodes, a through-electrode is placed in a first area where the plurality of avalanche photodiodes are two-dimensionally arranged, for example, in order to shorten the wiring distance from the avalanche photodiode. When the through-electrode is disposed outside of the first area, the wiring distance between the avalanche photodiode and the through-electrode is large, and the difference in the wiring distances between the avalanche photodiodes is large, as compared with when the through-electrode is disposed in the first area. The wiring distance is related to the wiring resistance, the parasitic capacitance, and the like, and affects the detection accuracy of the photodetecting device.

The through-hole where the through-electrode is arranged becomes a dead space for photodetection. Therefore, when the through-electrode is disposed in the first area, an effective area for photodetection is small, as compared with when the through-electrode is disposed outside of the first area. That is, the aperture ratio may decrease. When the aperture ratio decreases, photodetection characteristics of the photodetecting device are deteriorated.

In order to suppress the reduction of the aperture ratio, it is desirable that the dead space is as small as possible. For example, the aperture ratio is ensured by reducing the distance between the avalanche photodiode and the through-hole (through-electrode). When the distance between the avalanche photodiode and the through-hole is small, a surface leakage electric current flows easily from the through-hole to the avalanche photodiode, as compared with when the distance between the avalanche photodiode and the through-hole is large. Consequently, this may adversely affect the detection accuracy in the photodetecting device.

Therefore, the present inventors keenly studied a configuration in which the aperture ratio is ensured, and the inflow of the surface leakage electric current to the avalanche photodiode is reduced.

The present inventors have found a configuration in which a groove surrounding the through-hole at the first principal surface of the semiconductor substrate is formed in an area between the through-hole and a light receiving region of an avalanche photodiode adjacent to the through-hole. In this configuration, the groove surrounding the through-hole is formed in the area between the through-hole and the light receiving region of the avalanche photodiode adjacent to the through-hole, and therefore, even when the distance between the light receiving region and the through-electrode (through-hole) is small, a flow of a surface leakage electric current from the through-hole to the avalanche photodiode is reduced.

The present inventors also found that a new problem arises when a groove surrounding the through-hole is formed in the semiconductor substrate. The groove surrounding the through-hole is formed in a narrow area between the through-hole and the light receiving region. For this reason, a structural defect may occur in the area between the groove and the through-hole surrounded by the groove in the semiconductor substrate. The structural defect is, for example, cracking or chipping of the semiconductor substrate. When a first distance from an edge of the groove to an edge of the through-hole surrounded by the groove is equal to or less than a second distance from the edge of the groove to the edge of the light receiving region adjacent to the through-hole surrounded by the groove, a structural defect is likely to occur, as compared with when the first distance is longer than the second distance.

The present inventors found a configuration in which the first distance is longer than the second distance. According to this configuration, when the distance between the edge of the light receiving region and the edge of the through-hole adjacent to the light receiving region is small, and a groove surrounding the through-hole is formed between the light receiving region and the through-hole adjacent to the light receiving region in the semiconductor substrate, a structural defect is unlikely to occur in the area between the groove and the through-hole surrounded by the groove in the semiconductor substrate.

An aspect of the present invention is a photodetecting device including a semiconductor substrate including a first principal surface and a second principal surface opposing each other, a plurality of avalanche photodiodes operating in Geiger mode, and a through-electrode. Each of the plurality of avalanche photodiodes includes a light receiving region disposed at the first principal surface side of the semiconductor substrate, and the avalanche photodiodes are arranged two-dimensionally on the semiconductor substrate. The through-electrode is electrically connected to a corresponding light receiving region. The through-electrode is provided in a through-hole penetrating through the semiconductor substrate in a thickness direction in an area where the plurality of avalanche photodiodes are arranged two-dimensionally. At the first principal surface side of the semiconductor substrate, a groove surrounding the through-hole is formed between the through-hole and the light receiving region adjacent to the through-hole. A first distance between an edge of the groove and an edge of the through-hole surrounded by the groove is longer than a second distance between the edge of the groove and an edge of the light receiving region adjacent to the through-hole surrounded by the groove.

In the photodetecting device according to the aspect, at the first principal surface side of the semiconductor substrate, the groove surrounding the through-hole is formed in the area between the through-hole and the light receiving region adjacent to the through-hole, and therefore, the aperture ratio is ensured, and the flow of surface leakage electric current to the avalanche photodiode is reduced. Since the first distance is longer than the second distance, a structural defect is less likely to occur around the through-hole in the semiconductor substrate.

In the photodetecting device according to the aspect, each avalanche photodiode may include a first semiconductor region of a first conductivity type located at the first principal surface side of the semiconductor substrate, a second semiconductor region of a second conductivity type located at the second principal surface side of the semiconductor substrate, a third semiconductor region of the second conductivity type located between the first semiconductor region and the second semiconductor region and having a lower impurity concentration than the second semiconductor region, and a fourth semiconductor region of the first conductivity type formed in the first semiconductor region and having a higher impurity concentration than the first semiconductor region. In which case, the fourth semiconductor region may be the light receiving region, and a bottom surface of the groove may be constituted by the second semiconductor region. In this embodiment, the bottom surface of the groove is deeper than the third semiconductor region. Therefore, even when charges are generated in the area surrounded by the groove in the semiconductor substrate, this suppresses movement of the charges generated in the area to the avalanche photodiode. Since the bottom surface of the groove is formed in the semiconductor substrate, i.e., the groove does not reach the second principal surface of the semiconductor substrate, the semiconductor substrate will not be separated at the position of the groove. Therefore, in the manufacturing process of the photodetecting device, the semiconductor substrate is easily handled.

In the photodetecting device according to the aspect, each avalanche photodiode may include a first semiconductor region of a first conductivity type located at the first principal surface side of the semiconductor substrate, a second semiconductor region of the first conductivity type located at the second principal surface side of the semiconductor substrate and having a higher impurity concentration than the first semiconductor region, a third semiconductor region of a second conductivity type formed at the first principal surface side of the first semiconductor region, and a fourth semiconductor region of the first conductivity type formed in the first semiconductor region to be in contact with the third semiconductor region, and having a higher impurity concentration than the first semiconductor region. In which case, the third semiconductor region may be the light receiving region, and a bottom surface of the groove may be constituted by the second semiconductor region. In this embodiment, the bottom surface of the groove is deeper than the third semiconductor region. Therefore, even when charges are generated in the area surrounded by the groove in the semiconductor substrate, this suppresses movement of the charges generated in the area to the avalanche photodiode. Since the bottom surface of the groove is formed in the semiconductor substrate, i.e., the groove does not reach the second principal surface of the semiconductor substrate, the semiconductor substrate will not be separated at the position of the groove. Therefore, in the manufacturing process of the photodetecting device, the semiconductor substrate is easily handled.

The photodetecting device according to the aspect may include an electrode pad disposed on the first principal surface and electrically connected to the through-electrode. In which case, when viewed from a direction perpendicular to the first principal surface, the electrode pad may be located in an area surrounded by the groove and spaced apart from the groove. In this embodiment, when a configuration is employed in which the groove is filled with metal, a parasitic capacitance generated between the electrode pad and the metal in the groove is reduced.

In the photodetecting device according to the one aspect, when viewed from a direction perpendicular to the first principal surface, an area surrounded by the groove may have a polygonal shape, and the light receiving region may have a polygonal shape. When the area surrounded by the groove and the light receiving region have polygonal shapes, it is possible to employ a configuration in which the area surrounded by the groove and the light receiving region are arranged in such manner that a side of the area surrounded by the groove is along a side of the light receiving region. In the photodetecting device adopting this configuration, the dead space is small and the aperture ratio is high.

In the photodetecting device according to the aspect, when viewed from a direction perpendicular to the first principal surface, an opening of the through-hole may have a circular shape, and an insulating layer may be arranged on the inner peripheral surface of the through-hole. When the insulating layer is arranged on the inner peripheral surface of the through-hole, the through-electrode and the semiconductor substrate are electrically insulated from each other. When there is a corner at the opening of the through-hole, a crack may be formed at the corner of the insulating layer when the insulating layer is formed. Since the through-hole has a circular shape when viewed from a direction perpendicular to the first principal surface, cracks tend not to be generated in the insulating layer when the insulating layer is formed. Therefore, in this embodiment, electrical insulation between the through-electrode and the semiconductor substrate is ensured.

In the photodetecting device according to the aspect, the plurality of avalanche photodiodes may be arranged in a matrix. In which case, the through-hole may be formed in each area surrounded by four mutually adjacent avalanche photodiodes of the plurality of avalanche photodiodes. The through-hole may be provided with the through-electrode electrically connected to the light receiving region of one of the four mutually adjacent avalanche photodiodes. The groove may be formed in an area between the through-hole and the light receiving region of each of the four mutually adjacent avalanche photodiodes. In this embodiment, since the wiring distance between the through-electrode and the light receiving region electrically connected to the through-electrode is relatively short, it is unsusceptible to influence by the wiring resistance and the parasitic capacitance. Therefore, this suppresses degradation of the detection accuracy of the photodetecting device.

When viewed from a direction perpendicular to the first principal surface, the light receiving region may have a polygonal shape. In which case, when viewed from a direction perpendicular to the first principal surface, the groove may extend along a side adjacent to the through-hole, of a plurality of sides of the light receiving region of each of the four avalanche photodiodes adjacent to the through-hole. In this embodiment, the groove extends along the side of the light receiving region, and therefore, a configuration in which the distance between the through-hole and the light receiving region is short can be employed even when the through-hole is formed in each area surrounded by the four adjacent avalanche photodiodes. The photodetecting device that employs this configuration has a smaller dead space and a higher aperture ratio.

Advantageous Effects of Invention

An aspect of the present invention provides a photodetecting device in which the aperture ratio is ensured, and an inflow of a surface leakage electric current to the avalanche photodiode is reduced, and a structural defect is less likely to occur around the through-hole in the semiconductor substrate.

DESCRIPTION OF EMBODIMENTS

Figure 1:
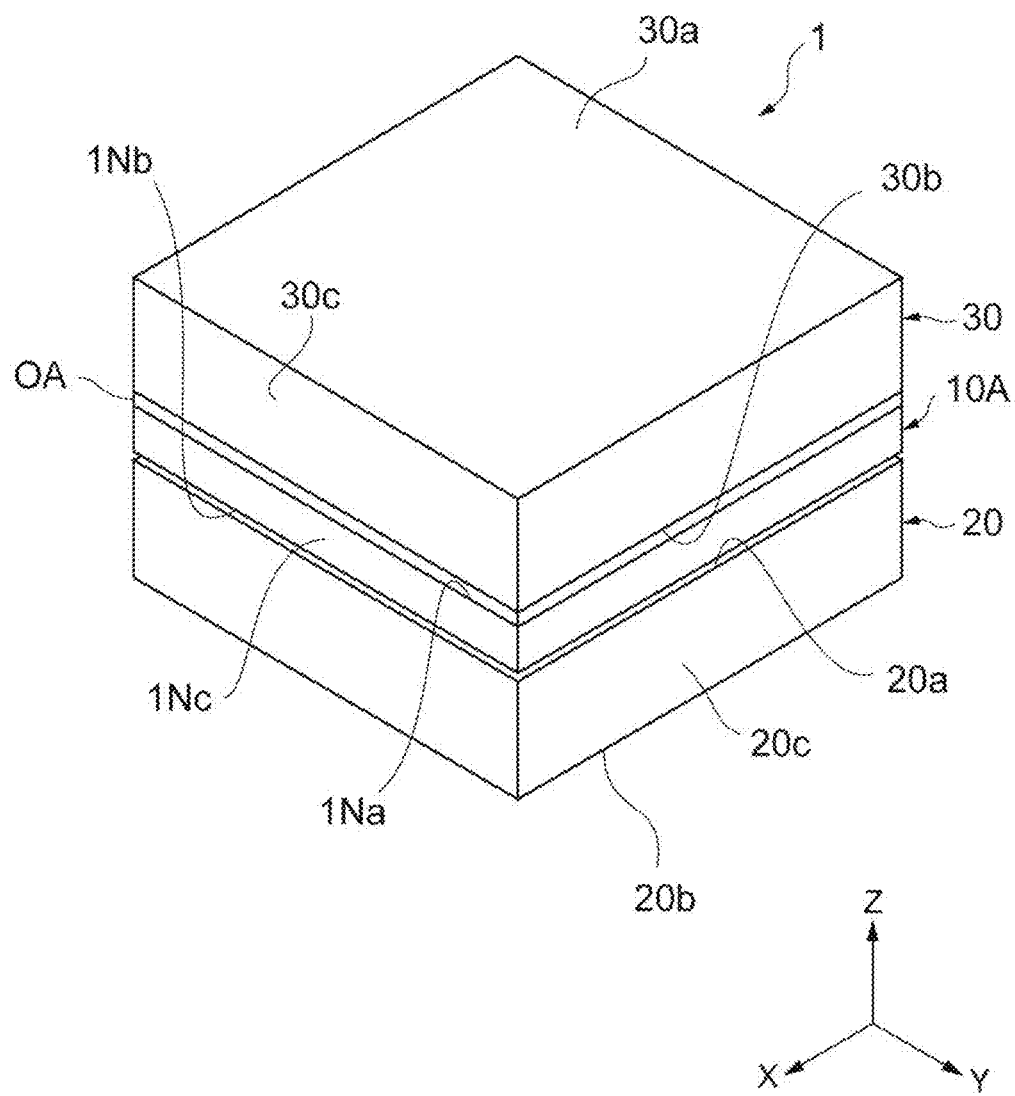
FIG. 1 is a schematic perspective view illustrating a photodetecting device according to an embodiment.

Embodiments of the present invention will be hereinafter described in detail with reference to the accompanying drawings. In the description, the same reference numerals are used for the same elements or elements having the same functions, and redundant descriptions thereabout are omitted.

Figure 2:
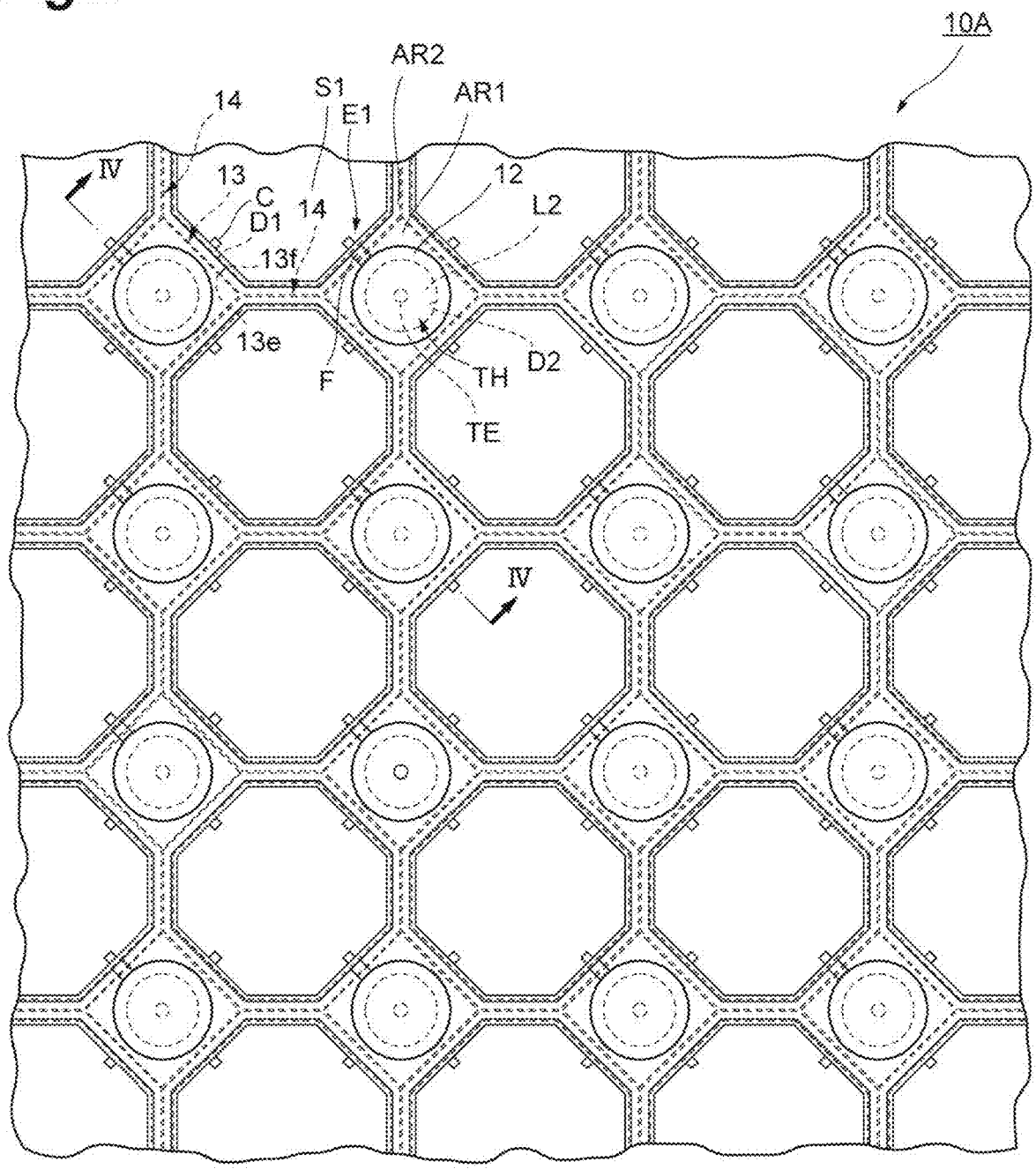
FIG. 2 is a schematic plan view illustrating a semiconductor photodetecting element.
Figure 2:
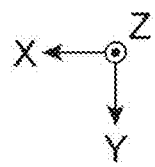
Figure 3:
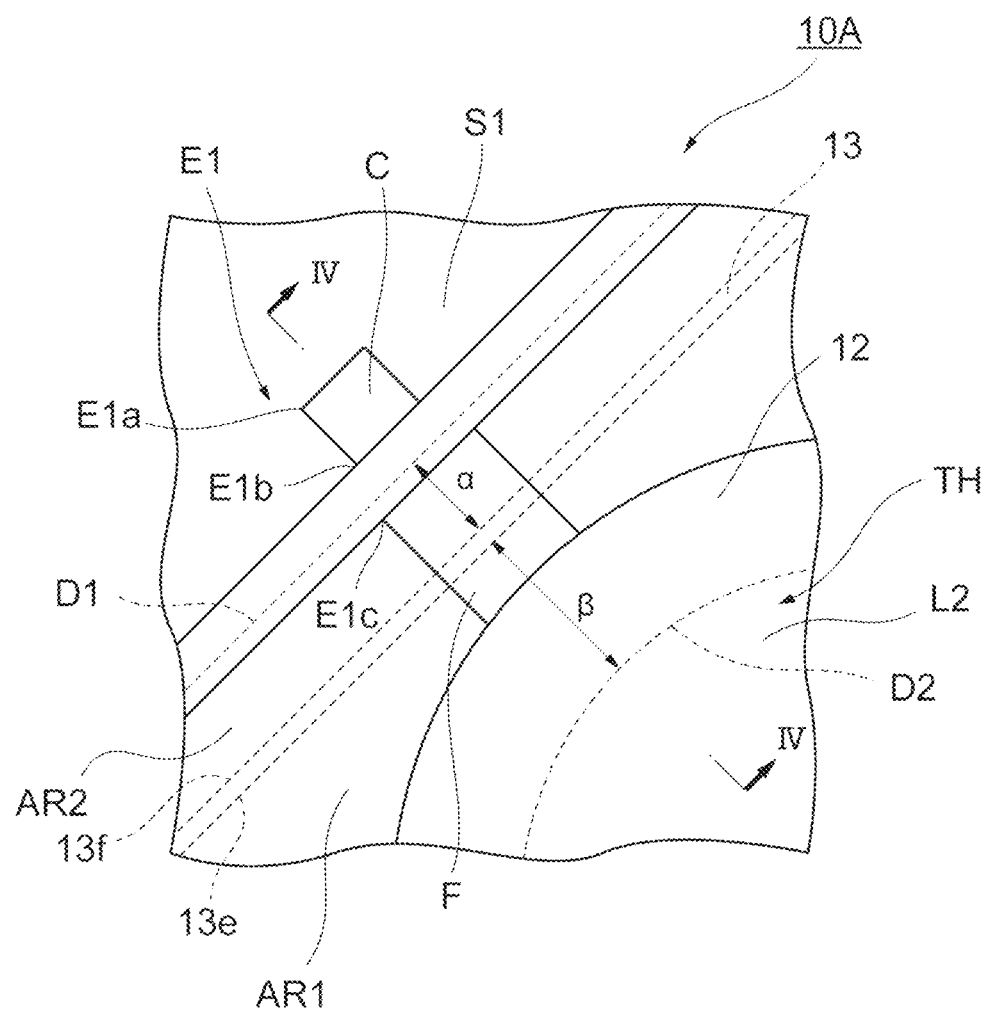
FIG. 3 is a schematic enlarged view illustrating the semiconductor photodetecting element.
Figure 4:
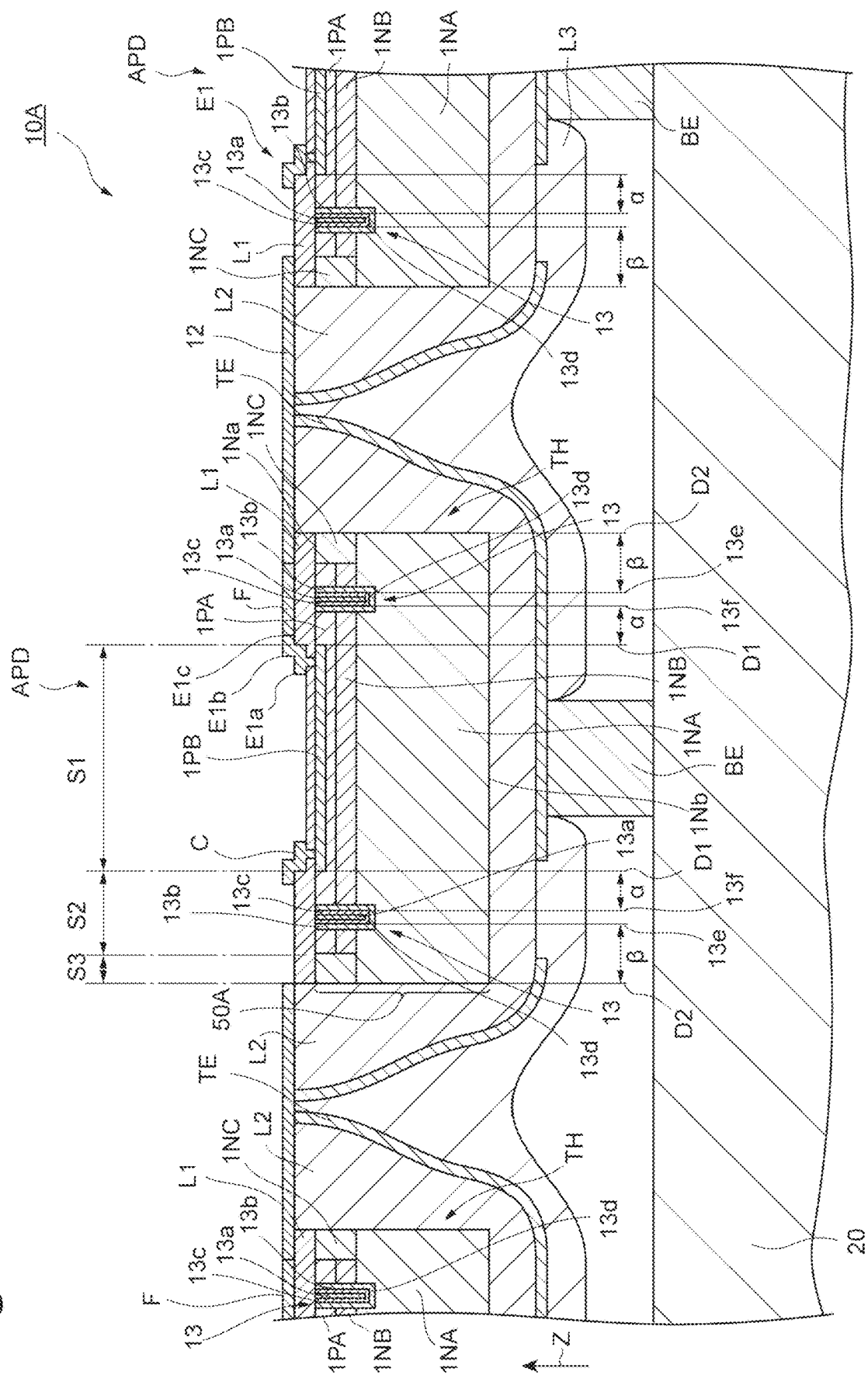
FIG. 4 is a diagram for describing a cross-sectional configuration along line IV-IV illustrated in FIG. 2.

First, a configuration of a photodetecting device 1 according to the present embodiment will be described with reference to FIG. 1 to FIG. 4. FIG. 1 is a schematic perspective view illustrating the photodetecting device according to the present embodiment. FIG. 2 is a schematic plan view illustrating semiconductor photodetecting elements. FIG. 3 is a schematic enlarged view illustrating a semiconductor photodetecting element. FIG. 4 is a diagram for describing a cross-sectional configuration along line IV-IV illustrated in FIG. 2.

As illustrated in FIG. 1, the photodetecting device 1 includes a semiconductor photodetecting element 10A, a mounting substrate 20, and a glass substrate 30. The mounting substrate 20 opposes the semiconductor photodetecting element 10A. The glass substrate 30 opposes the semiconductor photodetecting element 10A. The semiconductor photodetecting element 10A is disposed between the mounting substrate 20 and the glass substrate 30. In the present embodiment, a plane in parallel with each principal surface of the semiconductor photodetecting element 10A, the mounting substrate 20, and the glass substrate 30 is the XY-axis plane, and a direction perpendicular to each principal surface is the Z-axis direction.

The semiconductor photodetecting element 10A includes a semiconductor substrate 50A having a rectangular shape in a plan view. The semiconductor substrate 50A is made of Si and is an N type (second conductivity type) semiconductor substrate. The semiconductor substrate 50A includes a principal surface 1Na and a principal surface 1Nb that oppose each other.

As illustrated in FIG. 2, the semiconductor photodetecting element 10A includes a plurality of avalanche photodiodes APD and a plurality of through-electrodes TE. The plurality of avalanche photodiodes APD are two-dimensionally arranged on the semiconductor substrate 50A. In the present embodiment, the avalanche photodiodes APD are arranged in a matrix. In the present embodiment, the row direction is X-axis direction and the column direction is Y-axis direction. The avalanche photodiodes APD are arranged with an equal distance on a straight line when the avalanche photodiodes APD are viewed from each of the X-axis direction and the Y-axis direction.

Figure 6:
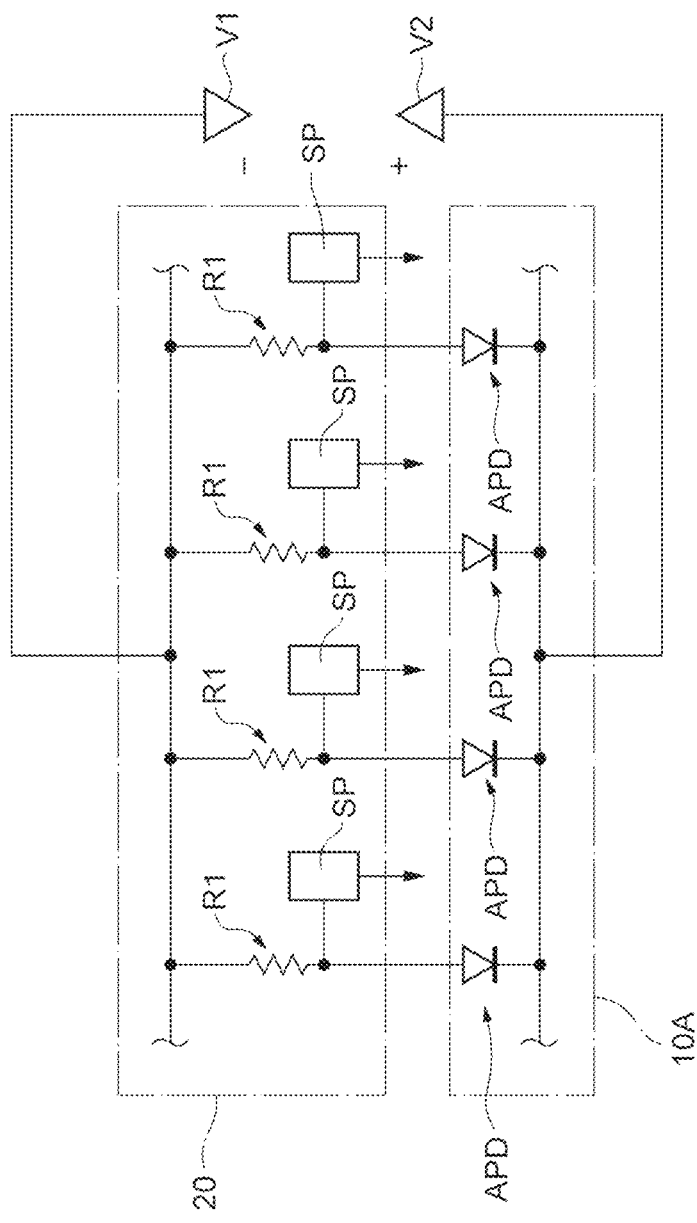
FIG. 6 is a circuit diagram of the photodetecting device.

Each avalanche photodiode APD includes a light receiving region S1 and operates in Geiger mode. The light receiving region S1 is arranged at a principal surface 1Na side of the semiconductor substrate 50A. As illustrated in FIG. 6, the avalanche photodiodes APD are connected in parallel in such a manner that a quenching resistor R1 is connected in series with each avalanche photodiode APD. A reverse bias voltage is applied to each avalanche photodiode APD from a power supply. The output electric current from each avalanche photodiode APD is detected by a signal processing unit SP. The light receiving region S1 is a charge generating region (a photosensitive region) configured to generate charges in response to incident light. That is, the light receiving region S1 is a photodetecting region.

The glass substrate 30 includes a principal surface 30a and a principal surface 30b that oppose each other. The glass substrate 30 has a rectangular shape in a plan view. The principal surface 30b opposes the principal surface 1Na of the semiconductor substrate 50A. The principal surface 30a and the principal surface 30b are flat. The glass substrate 30 and the semiconductor photodetecting element 10A are optically connected by an optical adhesive OA. The glass substrate 30 may be formed directly on the semiconductor photodetecting element 10A.

A scintillator (not illustrated) may be optically connected to the principal surface 30a of the glass substrate 30. In which case, the scintillator is connected to the principal surface 30a by an optical adhesive. The scintillation light from the scintillator passes through the glass substrate 30 and is incident on the semiconductor photodetecting element 10A.

The mounting substrate 20 includes a principal surface 20a and a principal surface 20b that oppose each other. The mounting substrate 20 has a rectangular shape in a plan view. The principal surface 20a opposes the principal surface 1Nb of the semiconductor substrate 50A. The mounting substrate 20 includes a plurality of electrodes arranged on the principal surface 20a. These electrodes are arranged corresponding to the through-electrodes TE.

The side surface 1Nc of the semiconductor substrate 50A, the side surface 30c of the glass substrate 30, and the side surface 20c of the mounting substrate 20 are flush with each other. That is, in the plan view, the outer edge of the semiconductor substrate 50A, the outer edge of the glass substrate 30, and the outer edge of the mounting substrate 20 match each other. The outer edge of the semiconductor substrate 50A, the outer edge of the glass substrate 30, and the outer edge of the mounting substrate 20 do not have to match each other. For example, in the plan view, the area of the mounting substrate 20 may be larger than the area of each of the semiconductor substrate 50A and the glass substrate 30. In which case, the side surface 20c of the mounting substrate 20 is located outside, in the XY-axis plane direction, of the side surface 1Nc of the semiconductor substrate 50A and the side surface 30c of the glass substrate 30.

Next, the structure of the semiconductor photodetecting element 10A will be described with reference to FIG. 2 and FIG. 3. FIG. 2 is a view illustrating the semiconductor photodetecting element 10A that is viewed from the direction perpendicular to the principal surface 1Na of the semiconductor substrate 50A (Z-axis direction). FIG. 3 illustrates an area where the groove is formed.

One avalanche photodiode APD constitutes one cell in the semiconductor photodetecting element 10A. Each avalanche photodiode APD includes one light receiving region S1. That is, the semiconductor photodetecting element 10A includes a plurality of light receiving regions S1. The light receiving region S1 has a polygonal shape when viewed from the Z-axis direction. The light receiving region S1 of the semiconductor photodetecting element 10A has a substantially regular octagonal shape when viewed from the Z-axis direction.

The plurality of light receiving regions S1 are two-dimensionally arranged when viewed from the Z-axis direction. In the present embodiment, the plurality of light receiving regions S1 are arranged in a matrix. The light receiving regions S are arranged with an equal distance on a straight line when viewed from each of the X-axis direction and the Y-axis direction. In the present embodiment, the light receiving regions S1 are arranged with a pitch of 100 μm. In the semiconductor photodetecting element 10A, two adjacent light receiving regions S1 are arranged in such a manner that one side of an octagon shape opposes each other.

Each avalanche photodiode APD includes an electrode E1. The electrode E1 is arranged on the principal surface 1Na side of the semiconductor substrate 50A. The electrode E1 is provided along the contour of the light receiving region S1 and has an octagonal ring shape.

The electrode E1 includes a connected portion C that is electrically connected to the light receiving region S1. The connected portions C are provided on the four sides of the light receiving region S1. The connected portions C are provided alternately on the sides of the light receiving region S1. In which case, the detection accuracy of the signal from the light receiving region S1 is ensured. As illustrated in FIG. 3, the connected portion C includes a first end portion E1a and a second end portion E1b and extends on the XY-axis plane from the outer edge toward the center of the light receiving region S1. As also illustrated in FIG. 4, the electrode E1 extends in the Z-axis direction at the second end portion E1b. Accordingly, a step is formed at the position of the second end portion E1b in the electrode E1. The electrode E1 extends from the step in the direction opposite to the center of the light receiving region S1. The electrode E1 includes a third end portion E1c that is electrically connected to the wiring F.

As illustrated also in FIG. 4, the wiring F extends from the third end portion E1c in the direction opposite to the center of the light receiving region S1. The wiring F electrically connects the electrode E1 and an electrode pad 12. The wiring F is located above the semiconductor substrate 50A outside of the light receiving region S1. The wiring F is formed above the semiconductor substrate 50A with an insulating layer L1 interposed therebetween.

The electrode E1 and a through-electrode TE are made of metal. The electrode E1 and the through-electrode TE are made of, for example, aluminum (Al). When the semiconductor substrate is made of Si, copper (Cu) is used as an electrode material instead of aluminum. The electrode E1 and the through-electrode TE may be integrally formed. The electrode E1 and the through-electrode TE are formed, for example, by sputtering.

The semiconductor photodetecting element 10A includes a plurality of the through-electrodes TE and a plurality of the electrode pads 12. Each through-electrode TE is electrically connected to a corresponding avalanche photodiode APD. Each electrode pad 12 is electrically connected to a corresponding through-electrode TE. The electrode pad 12 is electrically connected to the electrode E1 through the wiring F. The electrode pad 12 is arranged on the principal surface 1Na. Each through-electrode TE is electrically connected to the light receiving region S1 through the electrode pad 12, the wiring F, and the electrode E1. The electrode pad 12 is positioned in an area (the inner area of the groove 13) AR1 surrounded by the groove 13 when viewed from the Z-axis direction, and the electrode pad 12 is away from the groove 13.

The through-electrode TE is arranged for each avalanche photodiode APD. The through-electrode TE penetrates through the semiconductor substrate 50A from the principal surface 1Na side to the principal surface 1Nb side. The through-electrode TE is disposed in a through-hole TH penetrating through the semiconductor substrate 50A in the thickness direction (Z-axis direction). The through-hole TH is located in the area where multiple avalanche photodiodes APD are arranged two-dimensionally. In the semiconductor substrate 50A, a plurality of the through-holes TH are formed.

The opening of the through-hole TH is located in the XY-axis plane and has a circular shape when viewed from the Z-axis direction. The cross-sectional shape of the through-hole TH in the cross section in parallel with the XY-axis plane is a circular shape. The semiconductor photodetecting element 10A includes the insulating layer L2 on the inner peripheral surface of the through-hole TH. The through-electrode TE is arranged in the through-hole TH with the insulating layer L2 interposed therebetween.

The plurality of through-holes TH are arranged in such a manner that the centers of the openings are located in a matrix when viewed from the Z-axis direction. In the present embodiment, the row direction is X-axis direction and the column direction is Y-axis direction. The plurality of through-holes TH are arranged in such a manner that the centers of the openings are arranged with an equal distance on a straight line when viewed from each of the X-axis direction and the Y-axis direction. The through-holes TH are arranged with a pitch of 100 μm.

Each of the plurality of through-holes TH is formed in an area surrounded by four mutually adjacent avalanche photodiodes APD, of the plurality of avalanche photodiodes APD. In the through-hole TH, the through-electrode TE is arranged, the through-electrode TE being electrically connected to the light receiving region S1 of one of the four mutually adjacent avalanche photodiodes APD. That is, the through-electrode TE is electrically connected to the light receiving region S1 of the avalanche photodiode APD of one of the four avalanche photodiodes APD surrounding the through-hole TH in which the through-electrode TE is arranged.

The plurality of through-holes TH and the plurality of light receiving regions S1 are arranged in such a manner that, when viewed from the Z-axis direction, four through-holes TH surround one light receiving region S1 and four light receiving regions S1 surround one through-hole TH. The through-hole TH and the light receiving region S1 are alternately arranged in directions crossing the X-axis and the Y-axis.

Each of four sides of the eight sides of the light receiving region S1 opposes a side of an adjacent light receiving region S1, and the remaining four sides oppose the adjacent through-holes TH. One through-hole TH is surrounded by one side of the four light receiving regions S1 when viewed from the Z-axis direction. The connected portions C are provided on four sides opposing the through-hole TH, of the eight sides of the light receiving region S1.

The principal surface 1Na of the semiconductor substrate 50A includes the light receiving region S1, an intermediate area S2, and an opening peripheral area S3. The opening peripheral area S3 is an area located at the periphery of the opening of the through-hole TH of the principal surface 1Na. The intermediate area S2 is an area excluding the light receiving region S1 and the opening peripheral area S3 in the principal surface 1Na.

A groove 13 is formed in an intermediate area S2 between the light receiving regions S1 of the four mutually adjacent avalanche photodiodes APD and the through-hole TH surrounded by these avalanche photodiodes APD. The groove 13 extends along the sides adjacent to the through-hole TH, of the plurality of sides of the light receiving regions S1 of the four mutually adjacent avalanche photodiodes APD when viewed from the Z-axis direction. In the semiconductor photodetecting element 10A, the groove 13 surrounds the entire circumference of the through-hole TH when viewed from the Z-axis direction. The area AR1 surrounded by the groove 13 is a substantially square when viewed from the Z-axis direction. One through-hole TH is formed in any given area AR1.

A groove 14 is formed in the intermediate area S2 between two mutually adjacent light receiving regions S. The groove 14 extends along two opposing sides of two adjacent light receiving regions S1 when viewed from the Z-axis direction. The groove 14 connects the grooves 13 surrounding different through-holes TH. In the semiconductor photodetecting element 10A, the entire circumference of the light receiving region S1 is surrounded by the grooves 13 and 14. In one area AR2, one light receiving region S1 is provided. The area AR2 has substantially the same regular octagonal shape as the shape of the light receiving region S1. The areas AR1 and AR2 have a polygonal shape when viewed from the Z-axis direction.

The groove 14 extends in a straight line in the area between two adjacent light receiving regions S1. The groove 14 surrounding the two adjacent light receiving regions S1 is shared by two adjacent light receiving regions S1. The groove 14 located in the area between two adjacent light receiving regions S1 is not only a groove surrounding one light receiving region S1 abut also a groove surrounding the other light receiving region S1.

As illustrated in FIG. 3, a distance β from an edge 13e of the groove 13 to an edge D2 of the through-hole TH surrounded by the groove 13 is longer than a distance α from an edge 13f of the groove 13 to an edge D1 of the light receiving region S1 adjacent to the through-hole TH. In the present embodiment, the distance α is 5.5 μm and the distance β is 7.5 μm. The distance α is the shortest distance from the edge 13f of the groove 13 to the edge D1 of the light receiving region S1 adjacent to the through-hole TH when viewed from the Z-axis direction. The distance β is the shortest distance from the edge 13e of the groove 13 to the edge D2 of the through-hole TH surrounded by the groove 13 when viewed from the Z-axis direction.

Next, the cross-sectional configuration of the semiconductor photodetecting element according to the present embodiment will be described with reference to FIG. 4. In FIG. 4, the glass substrate 30 and the optical adhesive OA are not illustrated.

Each avalanche photodiode APD includes the light receiving region S1. Each avalanche photodiode APD includes a first semiconductor region 1PA of a P-type (first conductivity type), a second semiconductor region 1NA of an N-type (second conductivity type), a third semiconductor region 1NB of an N-type, and a fourth semiconductor region 1PB of P-type.

The first semiconductor region 1PA is located at the principal surface 1Na side of the semiconductor substrate 50A. The second semiconductor region 1NA is located at the principal surface 1Nb side of the semiconductor substrate 50A. The third semiconductor region 1NB is located between the first semiconductor region 1PA and the second semiconductor region 1NA and has a lower impurity concentration than the second semiconductor region 1NA. The fourth semiconductor region 1PB is formed inside of the first semiconductor region 1PA and has a higher impurity concentration than the first semiconductor region 1PA. The fourth semiconductor region 1PB is the light receiving region S1. Each avalanche photodiode APD is configured to include: a $P^+$ layer serving as the fourth semiconductor region 1PB; a P layer serving as the first semiconductor region 1PA; an N layer serving as the third semiconductor region 1NB; and an $N^+$ layer serving as the second semiconductor region 1NA, which are arranged in this order from the principal surface 1Na.

The first semiconductor region 1PA is located in the intermediate area S2 when viewed from the Z-axis direction and is positioned to surround the fourth semiconductor region 1PB (light receiving region S1). Although not illustrated in the drawing, the first semiconductor region 1PA is also located in the intermediate area S2 between two mutually adjacent light receiving regions S1 when viewed from the Z-axis direction. The intermediate area S2 of the semiconductor substrate 50A is configured to include: a P layer serving as the first semiconductor region 1PA; an N layer serving as the third semiconductor region 1NB; and an $N^+$ layer serving as the second semiconductor region 1NA, which are arranged in this order from the principal surface 1Na except the portion where the grooves 13, 14 are formed.

The inner surface 13b of the groove 13 is formed by the same N+ layer as the second semiconductor region 1NA. On the inner surface 13b, an insulating layer 13c is provided. A filling material 13a is provided in the area surrounded by the insulating layer 13c in the groove 13. The filling material 13a is made of, for example, a material that is easy to fill and has a high light shielding property. In the present embodiment, the filling material 13a is made of tungsten (W). Like the inner surface 13b, the inner surface of the groove 14 is formed by the same N+ layer as the second semiconductor region 1NA. An insulating layer 13c and a filling material 13a are provided in the groove 14 like the groove 13. FIG. 4 does not illustrate the groove 14, and the insulating layer 13c and the filling material 13a provided in the groove 14. The filling material 13a may be made of copper or aluminum instead of tungsten.

The depth of the grooves 13 and 14, i.e., a distance from the principal surface 1Na to the bottom surfaces of the grooves 13 and 14 in the Z-axis direction (the thickness direction of the semiconductor substrate 50A), is longer than a distance in the Z-axis direction from the principal surface 1Na to the interface between the second semiconductor region 1NA and the third semiconductor region 1NB, and shorter than the thickness of the semiconductor substrate 50A. The bottom surface 13d of the groove 13 is constituted by the second semiconductor region 1NA and is located closer to the principal surface 1Nb than the third semiconductor region 1NB.

The semiconductor substrate 50A includes an N-type fifth semiconductor region 1NC. The fifth semiconductor region 1NC is formed between the edge D2 of the through-hole TH and the first semiconductor region 1PA when viewed from the Z-axis direction. Like the second semiconductor region 1NA, the fifth semiconductor region 1NC is an N+ layer with a higher impurity concentration than the third semiconductor region 1NB. On the principal surface 1Na, an area where the fifth semiconductor region 1NC is formed is the opening peripheral area S3. The opening peripheral area S3 of the semiconductor substrate 50A is configured to include: an N+ layer serving as the fifth semiconductor region 1NC; and an N+ layer serving as the second semiconductor region 1NA, which are arranged in this order from the principal surface 1Na.

The inner peripheral surface (edge D2) of the through-hole TH is configured to include the fifth semiconductor region 1NC and the second semiconductor region 1NA, which are arranged in this order from the principal surface 1Na. Therefore, a PN junction formed by the first semiconductor region 1PA and the third semiconductor region 1NB is not exposed to the through-hole TH.

The avalanche photodiode APD includes an electrode E1. The connected portion C of the electrode E1 is connected to the fourth semiconductor region 1PB (light receiving region S1). As described above, the connected portion C includes the first end portion E1a and the second end portion E1b. The electrode E1 includes the third end portion E1c.

The first semiconductor region 1PA is electrically connected to the electrode E1 through the fourth semiconductor region 1PB.

The electrode pad 12 is electrically connected to the through-electrode TE. The through-electrode TE extends to the back side (adjacent to the principal surface 1Nb) of the semiconductor substrate 50A. The through-electrode TE is provided with an insulating layer L3 adjacent to the mounting substrate 20. The through-electrode TE is electrically connected to the mounting substrate 20 through a bump electrode BE on the back side of the semiconductor substrate 50A. The electrode E1 and the mounting substrate 20 are electrically connected to each other through the wiring F, the electrode pad 12, the through-electrode TE, and the bump electrode BE. The fourth semiconductor region 1PB is electrically connected to the mounting substrate 20 through the electrode E1, the wiring F, the electrode pad 12, the through-electrode TE, and the bump electrode BE. The bump electrode BE is made of, for example, solder.

The bump electrode BE is formed on the through-electrode TE extending on the principal surface 1Nb with an under bump metal (UBM), not illustrated, interposed therebetween. The UBM is made of a material with excellent electrical and physical connection with the bump electrode BE. The UBM is formed by, for example, an electroless plating method. The bump electrode BE is formed by, for example, a method of mounting a solder ball or a printing method.

Figure 5:
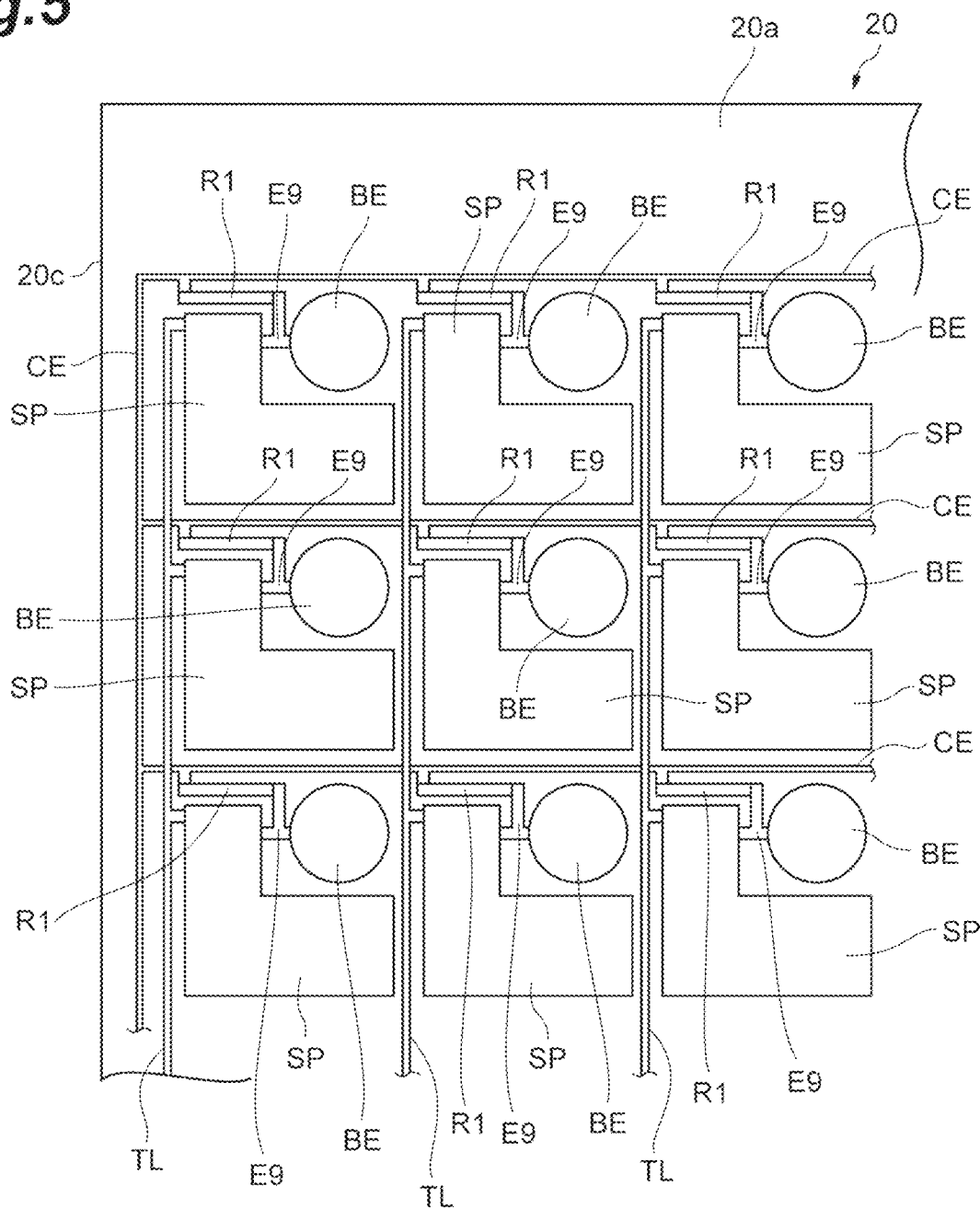
FIG. 5 is a schematic plan view illustrating a mounting substrate.

Next, the mounting substrate according to the present embodiment will be described with reference to FIG. 5. FIG. 5 is a schematic plan view of the mounting substrate. As illustrated in FIG. 5, the mounting substrate 20 includes a plurality of electrodes E9, a plurality of quenching resistors R1, and a plurality of signal processing units SP. The mounting substrate 20 constitutes an application specific integrated circuit (ASIC). The quenching resistor R1 may be located at the semiconductor photodetecting element 10A instead of the mounting substrate 20.

Each electrode E9 is electrically connected to the bump electrode BE. The electrode E9 is made of a metal just like the electrode E1 and the through-electrode TE. The electrode E9 is made of, for example, aluminum. The material constituting the electrode E9 may be copper instead of aluminum.

Each quenching resistor R1 is disposed on the principal surface 20a side. One end of the quenching resistor R1 is electrically connected to the electrode E9, and the other end of the quenching resistor R1 is connected to a common electrode CE. The quenching resistor R1 constitutes a passive quenching circuit. A plurality of quenching resistors R1 are connected in parallel to the common electrode CE.

Each signal processing unit SP is located on the principal surface 20a side. An input terminal of the signal processing unit SP is electrically connected to the electrode E9 and an output terminal of the signal processing unit SP is connected to the signal line TL. Each signal processing unit SP receives an output signal from the corresponding avalanche photodiode APD (semiconductor photodetecting element 10A) through the electrode E1, the through-electrode TE, the bump electrode BE, and the electrode E9. Each signal processing unit SP processes the output signal from the corresponding avalanche photodiode APD. Each signal processing unit SP includes a CMOS circuit that converts the output signal from the corresponding avalanche photodiode APD into a digital pulse.

Next, the circuit configuration of the photodetecting device 1 will be described with reference to FIG. 6. FIG. 6 is a circuit diagram of the photodetecting device. In the photodetecting device 1 (semiconductor photodetecting element 10A), an avalanche photodiode APD is formed by a PN junction formed between the N-type third semiconductor region 1NB and the P-type first semiconductor region 1PA. The semiconductor substrate 50A is electrically connected to an electrode (not illustrated) arranged on the back side, and the first semiconductor region 1PA is connected to the electrode E1 through the fourth semiconductor region 1PB. Each quenching resistor R1 is connected in series with the corresponding avalanche photodiode APD.

In the semiconductor photodetecting element 10A, each avalanche photodiode APD operates in Geiger mode. In Geiger mode, a reverse voltage (reverse bias voltage) greater than the breakdown voltage of the avalanche photodiode APD is applied to between the anode and the cathode of the avalanche photodiode APD. For example, a (−) potential V1 is applied to the anode and a (+) potential V2 is applied to the cathode. The polarities of these potentials are relative to each other, and one potential may be the ground potential.

The anode is the first semiconductor region 1PA and the cathode is the third semiconductor region 1NB. When light (photon) is incident on the avalanche photodiode APD, photoelectric conversion is performed inside of the substrate to generate photoelectrons. At an area near the PN junction interface of the first semiconductor region 1PA, avalanche multiplication is performed and the amplified electron group moves, toward the electrode arranged on the back side of the semiconductor substrate 50A. When light (photon) is incident on any cell (avalanche photodiode APD) of the semiconductor photodetecting element 10A, the light is multiplied and obtained from the electrode E9 as a signal. The signal retrieved from the electrode E9 is input to the corresponding signal processing unit SP.

As described above, the photodetecting device 1 is configured in such a manner that, on the principal surface 1Na side of the semiconductor substrate 50A, the groove 13 surrounding the through-hole TH is formed in the intermediate area S2 between the through-hole TH and the light receiving region S1 adjacent to the through-hole TH. Therefore, in the intermediate area S2 between the through-electrode TE and the light receiving region S1, the principal surface 1Na of the semiconductor substrate 50A is divided. As a result, even if the light receiving region S1 and the through-electrode TE are close to each other in order to ensure the aperture ratio of the avalanche photodiode APD, the flow of the surface leakage electric current from the through-electrode TE to the avalanche photodiode APD is reduced.

The distance β is longer than the distance α. Therefore, structural defects tend not to be generated around the through-holes TH in the semiconductor substrate 50A.

The bottom surface 13d of the groove 13 is constituted by the second semiconductor region 1NA. The bottom surface 13d of the groove 13 is located deeper than the third semiconductor region 1NB. Therefore, even when charges are generated in the area surrounded by the groove 13 in the semiconductor substrate 50A, this suppresses movement of the charges generated in the area to the avalanche photodiode APD. Since the bottom surface 13d of the groove 13 is formed in the semiconductor substrate 50A, i.e., the groove 13 does not reach the principal surface 1Nb of the semiconductor substrate 50A, the semiconductor substrate 50A will not be separated at the position of the groove 13. Therefore, in the manufacturing process of the photodetecting device 1, the semiconductor substrate 50A is easily handled.

In the groove 13, a filling material 13a made of tungsten is provided. Since the electrode pad 12 is spaced apart from the groove 13, the parasitic capacitance generated between the electrode pad 12 and the filling material 13a is reduced.

When viewed from the Z-axis direction, the area AR1 and the area AR2 have a polygonal shape and the light receiving region S1 has a polygonal shape. When the light receiving region S1 has a circular shape, there is no corner where the electric field concentrates. In the case where the light receiving region S1 has a circular shape, the dead space generated between the light receiving region S1 and the through-hole TH is large, as compared with when the light receiving region S1 has a polygonal shape. Therefore, it is difficult to ensure the aperture ratio. The areas AR1 and AR2, and the light receiving region S1 have a polygonal shape. The areas AR1 and AR2 and the light receiving region S1 are arranged in such a manner that the sides of the areas AR1 and AR2 are along the side of the light receiving region S1. For this reason, the photodetecting device 1 has a small dead space, and a high aperture ratio.

When viewed from the Z-axis direction, the opening of the through-hole TH has a circular shape, and the insulating layer L2 is arranged in the inner peripheral surface of the through-hole TH. Since the insulating layer L2 is disposed on the inner peripheral surface of the through-hole TH, the through-electrode TE and the semiconductor substrate 50A are electrically insulate from each other. When there is a corner at the opening of the through-hole TH, a crack may be formed at the corner of the insulating layer L2 when the insulating layer L2 is formed. In the present embodiment, since the through-hole TH has a circular shape when viewed from a direction perpendicular to the principal surface 1Na, cracks tend not to be generated in the insulating layer L2 when the insulating layer L2 is formed. Therefore, in the photodetecting device 1, electrical insulation between the through-electrode TE and the semiconductor substrate 50A is ensured.

The through-electrode TE is electrically connected to the light receiving region S1 of avalanche photodiode APD of one of the four mutually adjacent avalanche photodiodes APD. In which case, since the wiring distance between the through-electrode TE and the light receiving region S1 electrically connected to the through-electrode TE is relatively short, it is unsusceptible to influence by the wiring resistance and the parasitic capacitance. Therefore, this suppresses degradation of the detection accuracy of the photodetecting device 1.

The light receiving region S1 has a polygonal shape when viewed from the Z-axis direction. When viewed from the Z-axis direction, the groove 13 extends along the sides adjacent to the through-hole TH, of the plurality of the sides of the light receiving regions S1 of four avalanche photodiodes APD adjacent to the through-hole TH. Since the groove 13 extends along the sides of the light receiving regions S1, the distance between the through-hole TH and light receiving region S1 can be configured to be narrow even when the through-hole TH is formed in each area surrounded by four mutually adjacent avalanche photodiodes APD. For this reason, the photodetecting device 1 has a small dead space, and a high aperture ratio.

When the light receiving region S1 has an octagonal shape when viewed from the Z-axis direction, the area other than the through-electrode TE in the principal surface 1Na can be efficiently made use of. Therefore, the photodetecting device 1 achieves a configuration having a short wiring distance between the through-electrode TE and the light receiving region S1, and the aperture ratio is improved, as compared with in the case where the light receiving region S1 has other shapes.

When the filling material 13a disposed in the grooves 13, 14 is made of a metal, a parasitic capacitance may be generated between the filling material 13a and the light receiving region S1. When the value of parasitic capacitance differs according to the position between the filling material 13a and the light receiving region S1, i.e., when the value of parasitic capacitance is deviated, the photodetecting accuracy of the avalanche photodiode APD may be reduced. In the photodetecting device 1, the grooves 13 and 14 are formed in such a manner that the edges of the grooves 13 and 14 are along the edge D1 of the light receiving region S1 when viewed from the Z-axis direction. Therefore, even when a parasitic capacitance is generated between the filling material 13a and the light receiving region S1, the value of the parasitic capacitance is less likely to be biased. As a result, the avalanche photodiode APD is less affected by the parasitic capacitance.

The groove 14 surrounding the two adjacent light receiving regions S1 is formed in such a manner that the edge of the groove 14 is along the edge D1 of the light receiving region S1. The groove 14 is shared by two adjacent light receiving regions S1. Therefore, the avalanche photodiode APD is less affected by the parasitic capacitance. Furthermore, the area of the principal surface 1Na is effectively utilized, so that the light receiving regions S1 of the avalanche photodiodes APD are densely arranged. As a result, not only a reduction of the influence of the parasitic capacitance on the avalanche photodiode APD but also an improvement of the aperture ratio is realized.

Figure 7:
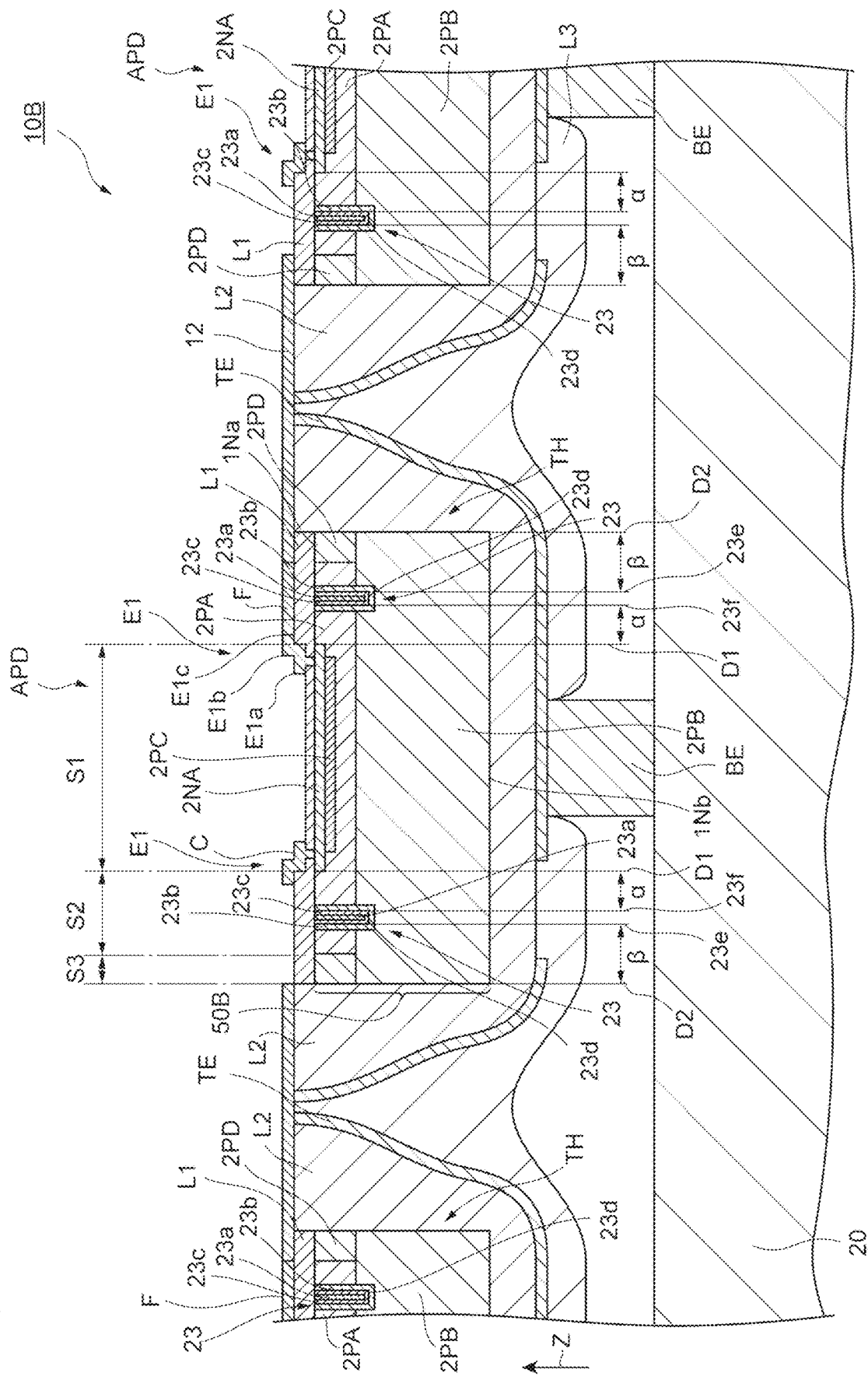
FIG. 7 is a diagram for describing a cross-sectional configuration of a photodetecting device according to a modification of the embodiment.

Next, a configuration of a photodetecting device according to a modification of the present embodiment will be described with reference to FIG. 7. FIG. 7 is a diagram for describing a cross-sectional configuration of a photodetecting device according to the modification of the present embodiment. FIG. 7 illustrates a cross-sectional configuration obtained when the photodetecting device according to this modification is cut along the plane corresponding to line IV-IV illustrated in FIG. 2. FIG. 7 also does not illustrate the glass substrate 30 and the optical adhesive OA. The modification is generally similar or the same as the above-described embodiment, but the modification differs from the above-described embodiment in the configuration of the avalanche photodiodes APD, as described below.

The photodetecting device according to the present modification includes a semiconductor photodetecting element 10B. The semiconductor photodetecting element 10B is disposed between the mounting substrate 20 and the glass substrate 30. The semiconductor photodetecting element 10B includes a semiconductor substrate 50B having a rectangular shape in a plan view. The semiconductor substrate 50B is made of Si and is an N type (second conductivity type) semiconductor substrate. The semiconductor substrate 50B includes a principal surface 1Na and a principal surface 1Nb that oppose each other. The semiconductor photodetecting element 10B includes a plurality of avalanche photodiodes APD and a plurality of through-electrodes TE. The plurality of avalanche photodiodes APD are two-dimensionally arranged on the semiconductor substrate 50B. In the present modification, the avalanche photodiodes APD are arranged in a matrix.

A groove 23 formed in the semiconductor photodetecting element 10B has the same configuration as the groove 13 formed in the semiconductor photodetecting element 10A. The groove 23 is formed in an intermediate area S2 between the light receiving regions S1 of the four mutually adjacent avalanche photodiodes APD and the through-hole TH surrounded by these avalanche photodiodes APD. The groove 23 extends along the sides adjacent to the through-hole TH, of the plurality of sides of the light receiving regions S1 of the four avalanche photodiodes APD adjacent to the through-hole TH when viewed from the Z-axis direction. In the semiconductor photodetecting element 10B, the groove 23 surrounds the entire circumference of the through-hole TH. The area AR1 surrounded by the groove 23 is substantially square when viewed from the Z-axis direction. In the present modification, one through-hole TH is also formed in any given area AR1.

A groove 14 is formed in the intermediate area S2 between two mutually adjacent light receiving regions S1. FIG. 7 does not illustrate the groove 14. The groove 14 extends along two opposing sides of two adjacent light receiving regions S1 when viewed from the Z-axis direction. The groove 14 connects the grooves 23 surrounding different through-holes TH. In the semiconductor photodetecting element 10B, the entire circumference of the light receiving region S1 is surrounded by the grooves 23 and 14. The area AR2 surrounded by the grooves 23 and 14 has substantially the same regular octagonal shape as the shape of the light receiving region S1. In the present modification, the areas AR1 and AR2 have a polygonal shape when viewed from the Z-axis direction. One light receiving region S1 is disposed in any given area AR2.

In the present modification, the groove 14 extends in a straight line in the area between two adjacent light receiving regions S1. The groove 14 surrounding the two adjacent light receiving regions S1 is shared by two adjacent light receiving regions S1.

As illustrated in FIG. 7, a distance β from an edge 23e of the groove 23 to an edge D2 of the through-hole TH surrounded by the groove 23 is longer than a distance α from an edge 23f of the groove 23 to an edge D1 of the light receiving region S1 adjacent to the through-hole TH. In the present modification, the distance α is 5.5 μm and the distance β is 7.5 μm. The distance α is the shortest distance from the edge 23f of the groove 23 to the edge D1 of the light receiving region S1 adjacent to the through-hole TH when viewed from the Z-axis direction. The distance β is the shortest distance from the edge 23e of the groove 23 to the edge D2 of the through-hole TH surrounded by the groove 23 when viewed from the Z-axis direction.

In the semiconductor photodetecting element 10B, each avalanche photodiode APD also includes the light receiving region S1. Each avalanche photodiode APD includes a first semiconductor region 2PA of P-type (first conductivity type), a second semiconductor region 2PB of P-type, a third semiconductor region 2NA of N-type, and a fourth semiconductor region 2PC of P-type.

The first semiconductor region 2PA is located at the principal surface 1Na side of the semiconductor substrate 50B. The second semiconductor region 2PB is located at the principal surface 1Nb side of the semiconductor substrate 50B, and has a higher impurity concentration than the first semiconductor region 2PA. The third semiconductor region 2NA is formed at the principal surface 1Na side of the first semiconductor region 2PA. The fourth semiconductor region 2PC is formed in the first semiconductor region 2PA to be in contact with the third semiconductor region 2NA and has a higher impurity concentration than the first semiconductor region 2PA. The third semiconductor region 2NA is the light receiving region S1. Each avalanche photodiode APD is configured to include: an $N^+$ layer serving as the third semiconductor region 2NA; a P layer serving as the fourth semiconductor region 2PC; a $P^-$ layer serving as the first semiconductor region 2PA; and a $P^+$ layer serving as the second semiconductor region 2PB, which are arranged in this order from the principal surface 1Na.

The first semiconductor region 2PA is located in the intermediate area S2 when viewed from the Z-axis direction and is positioned to surround the third semiconductor region 2NA that is the light receiving region S1. Although not illustrated in the drawing, the first semiconductor region 2PA is also located in the intermediate area S2 between two mutually adjacent light receiving regions S1 when viewed from the Z-axis direction. The intermediate area S2 of the semiconductor substrate 50B is configured to include: a P⁻ layer serving as the first semiconductor region 2PA; and a P⁺ layer serving as the second semiconductor region 2PB, which are arranged in this order from the principal surface 1Na except the portion where the grooves 23, 14 are formed.

The inner surface 23b of the groove 23 is formed by the same P₊ layer as the second semiconductor region 2PB. On the inner surface 23b, an insulating layer 23c is provided. A filling material 23a is provided in the area surrounded by the insulating layer 23c in the groove 23. The filling material 23a is made of, for example, a material that is easy to fill and has a high light shielding property. In the present modification, the filling material 23a is made of tungsten (W), which is the same as the filling material 13a. Like the inner surface 23b, the inner surface of the groove 14 is formed by the P⁺ layer having a higher impurity concentration than the first semiconductor region 2PA. An insulating layer 23c and a filling material 23a are provided in the groove 14 like the groove 23. As described above, FIG. 7 does not illustrate the groove 14, and the insulating layer 23c and the filling material 23a provided in the groove 14. The filling material 13a may be made of copper or aluminum instead of tungsten.

The depth of the grooves 23 and 14, i.e., a distance from the principal surface 1Na to the bottom surfaces of the grooves 23 and 14 in the Z-axis direction (the thickness direction of the semiconductor substrate 50B), is longer than a distance in the Z-axis direction from the principal surface 1Na to the interface between the first semiconductor region 2PA and the second semiconductor region 2PB, and shorter than the thickness of the semiconductor substrate 50B. The bottom surface 23d of the groove 23 is constituted by the second semiconductor region 2PB and is located closer to the principal surface 1Nb than the first semiconductor region 2PA.

The semiconductor substrate 50B includes a P-type fifth semiconductor region 2PD. The fifth semiconductor region 2PD is formed between the edge D2 of the through-hole TH and the first semiconductor region 2PA when viewed from the Z-axis direction. Like the second semiconductor region 2PB, the fifth semiconductor region 2PD is a P⁺ layer with a higher impurity concentration than the first semiconductor region 2PA. On the principal surface 1Na, an area where the fifth semiconductor region 2PD is formed is the opening peripheral area S3. The opening peripheral area S3 of the semiconductor substrate 50B is configured to include: a P⁺ layer serving as the fifth semiconductor region 2PD; and a P⁺ layer serving as the second semiconductor region 2PB, which are arranged in this order from the principal surface 1Na.

The inner peripheral surface (edge D2) of the through-hole TH is configured to include the fifth semiconductor region 2PD and the second semiconductor region 2PB, which are arranged in this order from the principal surface 1Na. Therefore, a PN junction formed by the third semiconductor region 2NA and the fourth semiconductor region 2PC is not exposed to the through-hole TH.

The avalanche photodiode APD includes an electrode E1. The electrode E1 is arranged at the principal surface 1Na side of the semiconductor substrate 50B. In the present modification, the electrode E1 is provided along the contour of the light receiving region S1 and has an octagonal ring shape.

The electrode E1 includes a connected portion C that is electrically connected to the light receiving region S1. In the present modification, as illustrated in FIG. 7, the connected portion C includes a first end portion E1a and a second end portion E1b. The electrode E1 includes a third end portion E1c that is electrically connected to the wiring F.

As illustrated in FIG. 7, the wiring F extends from the third end portion E1c in the direction opposite to the center of the light receiving region S1. The wiring F electrically connects the electrode E1 and an electrode pad 12. The wiring F is located above the semiconductor substrate 50B outside of the light receiving region S1. The wiring F is formed above the semiconductor substrate 50B with an insulating layer L1 interposed therebetween.

In the present modification, the electrode pad 12 is also electrically connected to the through-electrode TE. The through-electrode TE extends to the back side (adjacent to the principal surface 1Nb side) of the semiconductor substrate 50B. The through-electrode TE is provided with an insulating layer L3. The through-electrode TE is electrically connected to the mounting substrate 20 via the bump electrode BE. The electrode E1 and the mounting substrate 20 are electrically connected to each other through the wiring F, the electrode pad 12, the through-electrode TE, and the bump electrode BE. The third semiconductor region 2NA is electrically connected to the mounting substrate 20 through the electrode E1, the wiring F, the electrode pad 12, the through-electrode TE, and the bump electrode BE.

As described above, according to the present modification, on the principal surface 1Na side of the semiconductor substrate 50B, the groove 23 surrounding the through-hole TH is formed in the intermediate area S2 between the through-hole TH and the light receiving region S1 adjacent to the through-hole TH. Therefore, in the intermediate area S2 between the through-electrode TE and the light receiving region S1, the principal surface 1Na of the semiconductor substrate 50B is divided. As a result, even if the light receiving region S1 and the through-electrode TE are close to each other in order to ensure the aperture ratio of the avalanche photodiode APD, the flow of the surface leakage electric current from the through-electrode TE to the avalanche photodiode APD is reduced.

The distance β is longer than the distance α. Therefore, structural defects tend not to be generated around the through-holes TH in the semiconductor substrate 50B.

The bottom surface 23d of the groove 23 is constituted by the second semiconductor region 2PB. The bottom surface 23d of the groove 23 is located deeper than the first semiconductor region 2PA. Therefore, even when charges are generated in the area surrounded by the groove 23 in the semiconductor substrate 50B, this suppresses movement of the charges generated in the area to the avalanche photodiode APD. Since the bottom surface 23d of the groove 23 is formed in the semiconductor substrate 50B, i.e., the groove 23 does not reach the principal surface 1Nb of the semiconductor substrate 50B, the semiconductor substrate 50B will not be separated at the position of the groove 23. Therefore, in the manufacturing process of the photodetecting device according to the present modification, the semiconductor substrate 50B is easily handled.

Next, the configurations of modifications of the semiconductor photodetecting element will be described with reference to FIG. 8 to FIG. 11. FIG. 8 to FIG. 11 are schematic plan views illustrating the modifications of the semiconductor photodetecting element.

Semiconductor photodetecting elements 10C, 10D, 10E, and 10F are disposed between a mounting substrate 20 and a glass substrate 30. Like the semiconductor photodetecting element 10A, the semiconductor photodetecting elements 10C, 10D, 10E, and 10F include a semiconductor substrate 50A having a rectangular shape in a plan view. The semiconductor photodetecting elements 10C, 10D, 10E, and 10F include a plurality of avalanche photodiodes APD and a plurality of through-electrodes TE.

Figure 8:
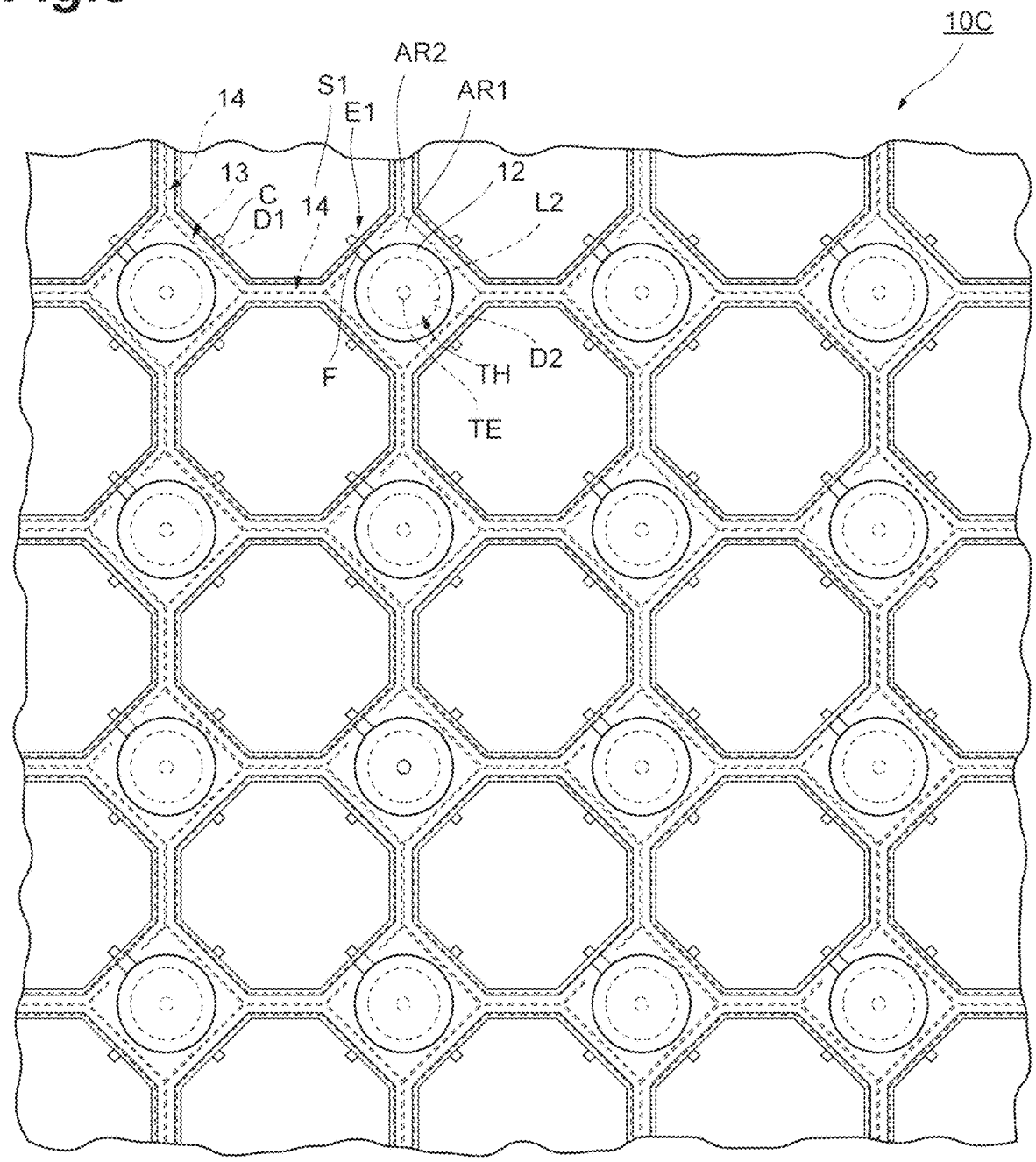
FIG. 8 is a schematic plan view illustrating a modification of a semiconductor photodetecting element.

In the semiconductor photodetecting element 10C as illustrated in FIG. 8, a groove 13 is formed in an intermediate area S2 between the through-hole TH and the light receiving region S1 adjacent to the through-hole TH. The groove 13 surrounds the through-hole TH. The groove 13 is not formed in an area arranged with the wiring F that electrically connects the through-electrode TE and the light receiving region S1 when viewed from the Z-axis direction. The groove 13 surrounds the through-hole TH in such a state that the groove 13 is divided by the area where the wiring F is arranged when viewed from the Z-axis direction.

Figure 9:
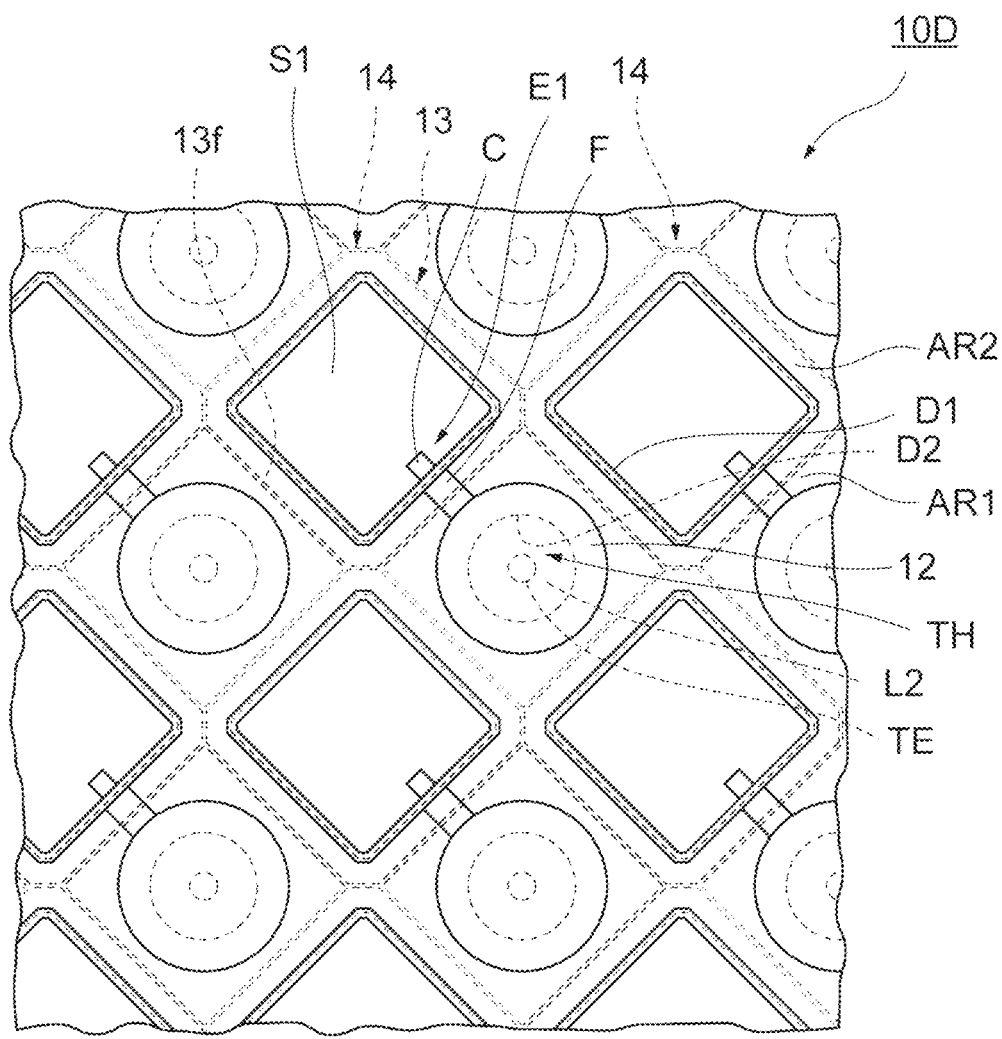
FIG. 9 is a schematic plan view illustrating a modification of a semiconductor photodetecting element.

In the semiconductor photodetecting element 10D as illustrated in FIG. 9, a groove 13 is formed in the intermediate area S2 between a through-hole TH and the light receiving region S1 adjacent to the through-hole TH. The groove 13 surrounds the through-hole TH. FIG. 2 and FIG. 9 are scaled differently. The size of the electrode pad 12 of the semiconductor photodetecting element 10D is the same as the size of the electrode pad 12 of the semiconductor photodetecting element 10A.

The through-holes TH and the light receiving regions S1 are two-dimensionally arranged. Each pitch of the through-hole TH and the light receiving region S1 is less than those of the semiconductor photodetecting element 10A. In the semiconductor photodetecting element 10D, the through-hole TH and the light receiving region S1 are arranged in a one-to-one relationship to achieve a higher resolution than the semiconductor photodetecting element 10A. Each pitch of the light receiving region S1 and the through-hole TH is, for example, 70 μm.

In the semiconductor photodetecting element 10D, the groove 13 surrounds the through-hole TH, like the semiconductor photodetecting element 10A. Like the semiconductor photodetecting element 10A, the groove 14 also extends along two opposing sides of two adjacent light receiving regions S1 when viewed from the Z-axis direction. The groove 14 connects the grooves 13 surrounding different through-holes TH. In the semiconductor photodetecting element 10D, the entire circumference of the light receiving region S1 is also surrounded by the grooves 13 and 14.

In the semiconductor photodetecting element 10D, each pitch of the through-electrode TE and the light receiving region S1 is smaller than those of the semiconductor photodetecting element 10A. In the semiconductor photodetecting element 10D, the groove 14 surrounding the two adjacent light receiving regions S1 is formed in such a manner that the edge of the groove 14 is along the edge D1 of the light receiving region S1, like the semiconductor photodetecting element 10A. The groove 14 is shared by two adjacent light receiving regions S1. Therefore, the avalanche photodiode APD is less affected by the parasitic capacitance. In addition, the area of the principal surface 1Na is effectively utilized, and the light receiving regions S1 of the avalanche photodiodes APD are densely arranged.

It is difficult to reduce the size of the through-electrode TE because of problems in machining accuracy or ensuring electrical connection. In order to reduce the parasitic capacitance generated between the electrode pad 12 and the filling material 13a in the grooves 13 and 14, the grooves 13 and 14 are separated from the electrode pad 12. In order to improve the aperture ratio, the light receiving region S1 has a polygonal shape.

Under these conditions, the light receiving region S1 of the semiconductor photodetecting element 10D has a polygonal shape different from the light receiving region S1 of the semiconductor photodetecting element 10A. More specifically, the light receiving region S1 of the semiconductor photodetecting element 10D has a polygonal shape in which the length of the side opposing the adjacent light receiving region S1 is shorter than the length of the side opposing the adjacent through-hole TH.

With this configuration, in the semiconductor photodetecting element 10D, the resolution is higher than that of the semiconductor photodetecting element 10A, and the semiconductor photodetecting element 10D achieves a higher aperture ratio. The parasitic capacitance generated among the avalanche photodiode APD, the filling material 13a, and the electrode pad 12 is reduced.

Figure 10:
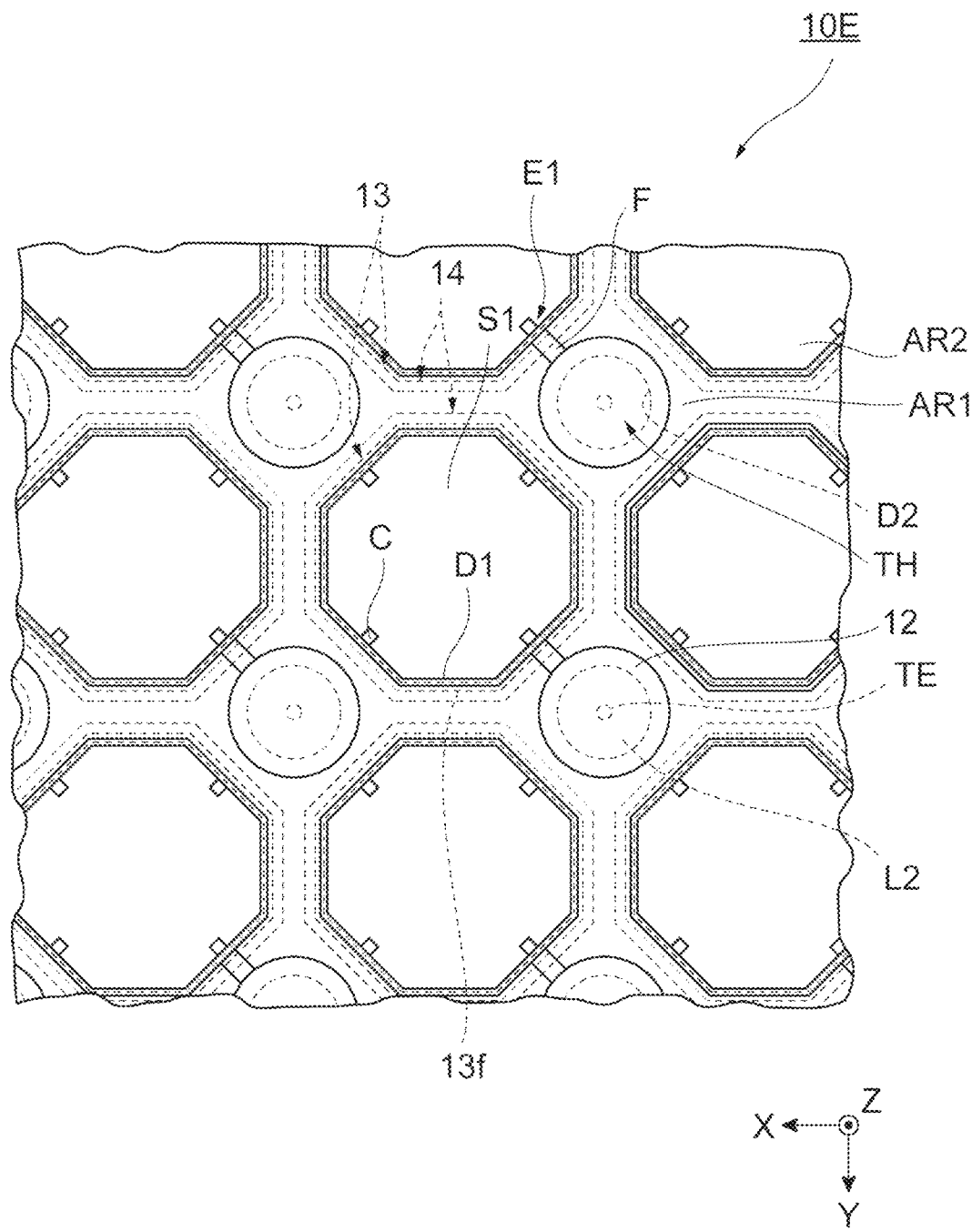
FIG. 10 is a schematic plan view illustrating a modification of a semiconductor photodetecting element.

In the semiconductor photodetecting element 10E illustrated in FIG. 10, the groove 13 is formed in the intermediate area S2 between the through-hole TH and the light receiving region S1 adjacent to the through-hole TH. The groove 13 surrounds the through-hole TH. FIG. 2 and FIG. 10 are scaled differently. The size of the electrode pad 12 of the semiconductor photodetecting element 10E is the same as the size of the electrode pad 12 of the semiconductor photodetecting element 10A.

In the semiconductor photodetecting element 10E, the pitch of the through-hole TH is the same as the pitch of the through-hole TH of the semiconductor photodetecting element 10A, the pitch of the light receiving region S1 is the same as the pitch of the light receiving region S1 of the semiconductor photodetecting element 10A. The through-hole TH and the light receiving region S1 are arranged in such a manner that the through-hole TH and the light receiving region S1 are arranged in a one-to-one relationship. Like the light receiving region S1 of the semiconductor photodetecting element 10A, the light receiving region S1 of the semiconductor photodetecting element 10E has a substantially octagonal shape. The area of the light receiving region S1 of the semiconductor photodetecting element 10E is smaller than the area of the light receiving region S1 of the semiconductor photodetecting element 10A. In the semiconductor photodetecting element 10E, two grooves 14 extend in the area between two mutually adjacent light receiving regions S1. One groove 14 surrounds one light receiving region S1 and the other groove 14 surrounds the other light receiving region S1. That is, the groove 14 is not shared by two adjacent light receiving regions S1.

The groove 13 of the semiconductor photodetecting element 10E surrounds the through-hole TH in such a state that the grooves 13 are separated in the row direction and the column direction in which the through-holes TH are arranged. Like the groove 14 of the semiconductor photodetecting element 10A, the groove 14 of the semiconductor photodetecting element 10E also extends along two opposing sides of two adjacent light receiving regions S1 when viewed from the Z-axis direction. The groove 14 connects the grooves 13 surrounding different through-holes TH. In the semiconductor photodetecting element 10E, the entire circumference of the light receiving region S1 is also surrounded by the grooves 13 and 14.

In order to reduce the influence of the parasitic capacitance on the avalanche photodiode APD, the grooves 13 and 14 are formed in such a manner that the edges of the grooves 13 and 14 are along the edge D1 of the light receiving region S1. It is difficult to reduce the size of the through-electrode TE because of problems in machining accuracy or ensuring electrical connection. In order to reduce the parasitic capacitance generated between the electrode pad 12 and the filling material 13a in the grooves 13 and 14, the grooves 13 and 14 are separated from the electrode pad 12.

In the semiconductor photodetecting element 10E, since two grooves 14 extend in the area between two mutually adjacent light receiving regions S1, the crosstalk between the light receiving regions S1 is reduced to a level lower than the semiconductor photodetecting element 10A. Therefore, in the semiconductor photodetecting element 10E, the crosstalk between the light receiving regions S1 is reduced to a level lower than the semiconductor photodetecting element 10A, and the parasitic capacitance generated between the avalanche photodiode APD, the filling material 13a, and the electrode pad 12 is reduced.

Figure 11:
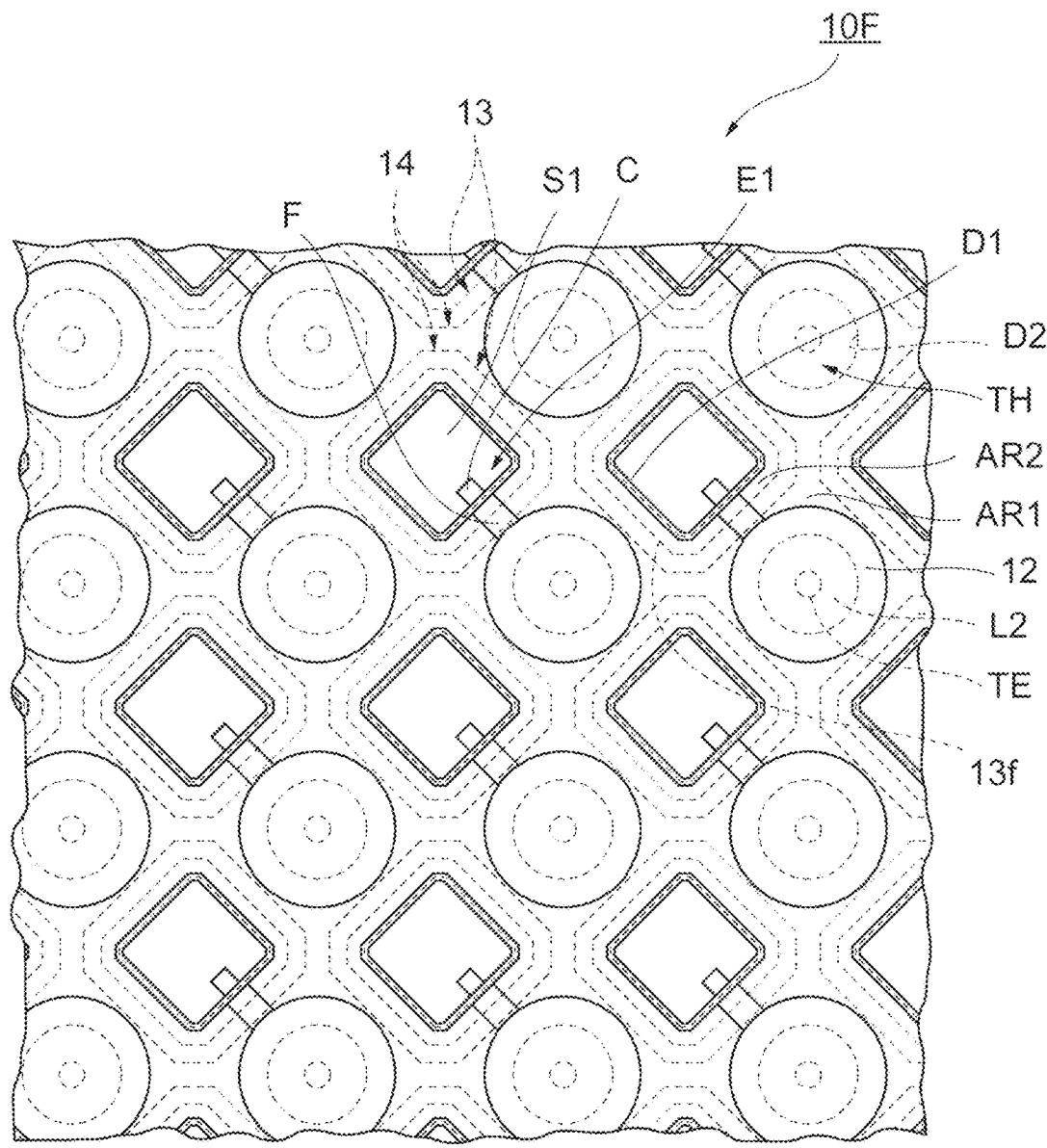
FIG. 11 is a schematic plan view illustrating a modification of a semiconductor photodetecting element.
Figure 11:
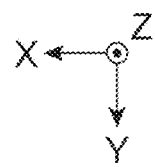

In the semiconductor photodetecting element 10F illustrated in FIG. 11, the groove 13 is formed in the intermediate area S2 between the through-hole TH and the light receiving region S1 adjacent to the through-hole TH. The groove 13 surrounds the through-hole TH. FIG. 10 and FIG. 11 are scaled differently. The size of the electrode pad 12 of the semiconductor photodetecting element 10F is the same as the size of the electrode pad 12 of the semiconductor photodetecting element 10E.

The through-holes TH and the light receiving regions S1 are two-dimensionally arranged. Each pitch of the through-hole TH and the light receiving region S1 is less than those of the semiconductor photodetecting element 10E. In the semiconductor photodetecting element 10F, the through-hole TH and the light receiving region S1 are arranged in a one-to-one relationship to achieve a higher resolution than the semiconductor photodetecting element 10E. Each pitch of the light receiving region S1 and the through-hole TH is, for example, 50 μm.

The groove 13 of the semiconductor photodetecting element 10F surrounds the through-hole TH in such a state that the grooves 13 are separated in the row direction and the column direction in which the through-holes TH are arranged. Like the groove 14 of the semiconductor photodetecting element 10E, the groove 14 of the semiconductor photodetecting element 10F also extends along two opposing sides of two adjacent light receiving regions S1 when viewed from the Z-axis direction. The groove 14 connects the grooves 13 surrounding different through-holes TH. In the semiconductor photodetecting element 10F, the entire circumference of the light receiving region S1 is also surrounded by the grooves 13 and 14.

In order to reduce the influence of the parasitic capacitance on the avalanche photodiode APD, the grooves 13 and 14 are formed in such a manner that the edges of the grooves 13 and 14 are along the edge D1 of the light receiving region S1. It is difficult to reduce the size of the through-electrode TE because of problems in machining accuracy or ensuring electrical connection. In order to reduce the parasitic capacitance generated between the electrode pad 12 and the filling material 13a in the grooves 13 and 14, the grooves 13 and 14 are separated from the electrode pad 12.

Under these conditions, the groove 14 is not shared by two adjacent light receiving regions S1, and the light receiving region S1 of the semiconductor photodetecting element 10F has a polygonal shape different from the light receiving region S1 of the semiconductor photodetecting element 10E. More specifically, the light receiving region S1 of the semiconductor photodetecting element 10F has a polygonal shape in which the length of the side opposing the adjacent light receiving region S1 is shorter than the length of the side opposing the adjacent through-hole TH.

With this configuration, in the semiconductor photodetecting element 10F, the resolution is higher than that of the semiconductor photodetecting element 10E, and the semiconductor photodetecting element 10F has a higher aperture ratio. The parasitic capacitance generated among the avalanche photodiode APD, the filling material 13a, and the electrode pad 12 is reduced.

Although the preferred embodiments and modifications of the present invention have been described above, the present invention is not necessarily limited to the above-described embodiments and modifications, and various modifications can be made without departing from the gist thereof.

In the above-described embodiment and modifications, a single avalanche photodiode APD is electrically connected to a single through-electrode TE (a single electrode pad 12), but the present embodiment and modification are not limited thereto. A plurality of avalanche photodiodes APD may be electrically connected to a single through-electrode TE (a single electrode pad 12).

In the above-described embodiment and modifications, two types of layer structures, i.e., the semiconductor substrate 50A and the semiconductor substrate 50B, are illustrated as the avalanche photodiode APD, but the layer structure of the semiconductor substrate is not limited thereto. In the avalanche photodiode APD provided in the semiconductor substrate 50A, for example, the second semiconductor region 1NA and the third semiconductor region 1NB may be made of a single semiconductor region. In which case, the avalanche photodiode APD includes a semiconductor region of a first conductivity type (for example, N-type), a semiconductor region of a second conductivity type (for example, P-type) forming a pn junction with the semiconductor region of the first conductivity type, and another semiconductor region of the second conductivity type that is located in the semiconductor region of the second conductivity type and that has a higher impurity concentration than the semiconductor region of the second conductivity type. In this configuration, the semiconductor region of the second conductivity type having the higher impurity concentration is the light receiving region. In the avalanche photodiode APD provided in the semiconductor substrate 50B, for example, the first semiconductor region 2PA, the second semiconductor region 2PB, and the fourth semiconductor region 2PC may be made of a single semiconductor region. In which case, the avalanche photodiode APD includes a semiconductor region of a first conductivity type (for example, P-type), and a semiconductor region of a second conductivity type (for example N-type) that is located in the semiconductor region of the first conductivity type and that forms a pn junction with the semiconductor region of the first conductivity type. In this configuration, the semiconductor region of the second conductivity type is the light receiving region.

In the semiconductor substrate 50A and the semiconductor substrate 50B, each conductivity type of P-type and N-type may be exchanged to be opposite to the above conductivity type. The light receiving region S1 of the semiconductor substrate 50A may be configured to include $N^+$ layer, N layer, P layer, and $P^+$ layer, which are arranged in this order from the principal surface 1Na. The light receiving region S1 of the semiconductor substrate 50B is configured to include $P^+$ layer, N layer, $N_{-\ layer}$, $N^+$ layer, which are arranged in this order from the principal surface 1Na.

In the above-described embodiment and modifications, the distance α is 5.5 μm and the distance β is 7.5 μm. The distance α and the distance β may be other than the above values as long as the distance β is longer than the distance α.

Although in the above-described embodiment and modifications, the light receiving regions S1 are described as having the polygonal shape when viewed from the Z-axis direction, other shapes may be used. For example, the light receiving regions S1 may have a circular shape, or any other suitable shape. Although in the above-described embodiment and modifications, the through-holes TH are described as having the circular shape when viewed from the Z-axis direction, other shapes may be used. For example, the through-holes TH may have a polygonal shape, or any other suitable shape.

INDUSTRIAL APPLICABILITY

The present invention can be used for a photodetecting device to detect weak light.

REFERENCE SIGNS LIST 1 photodetecting device
12 electrode pad
13, 23 groove
13d, 23d bottom surface
50A, 50B semiconductor substrate
1Na, 1Nb principal surface
S1 light receiving region
S2 intermediate area
APD avalanche photodiode
TH through-hole
TE through-electrode
α, β distance
1PA first semiconductor region
1PB fourth semiconductor region
1NA second semiconductor region
1NB third semiconductor region
2PA first semiconductor region
2PB second semiconductor region
2PC fourth semiconductor region
2NA third semiconductor region
AR1, AR2 area
D1, D2, 13e, 13f edge.

The invention claimed is:

1. A photodetecting device comprising:
a semiconductor substrate including a first principal surface and a second principal surface that oppose each other;
a plurality of avalanche photodiodes each including a light receiving region disposed at the first principal surface side of the semiconductor substrate, the avalanche photodiodes being arranged two-dimensionally at the semiconductor substrate, and operating in Geiger mode; and
a through-electrode electrically connected to a corresponding light receiving region,
wherein the through-electrode is provided in a through-hole penetrating through the semiconductor substrate in a thickness direction in an area where the plurality of avalanche photodiodes are arranged two-dimensionally,
at the first principal surface of the semiconductor substrate, a groove surrounding the through-hole is formed in an area between the through-hole and the light receiving region adjacent to the through-hole, and
a first distance between an edge of the groove and an edge of the through-hole surrounded by the groove is longer than a second distance between an edge of the groove and an edge of the light receiving region adjacent to the through-hole surrounded by the groove.

2. The photodetecting device according to claim 1, wherein each of the avalanche photodiodes includes:
a first semiconductor region of a first conductivity type located at the first principal surface of the semiconductor substrate;
a second semiconductor region of a second conductivity type located at the second principal surface of the semiconductor substrate;
a third semiconductor region of the second conductivity type located between the first semiconductor region and the second semiconductor region and having a lower impurity concentration than the second semiconductor region; and
a fourth semiconductor region of the first conductivity type formed in the first semiconductor region and having a higher impurity concentration than the first semiconductor region,
wherein the fourth semiconductor region is the light receiving region, and
a bottom surface of the groove is constituted by the second semiconductor region.

3. The photodetecting device according to claim 1, wherein each of the avalanche photodiodes includes:
a first semiconductor region of a first conductivity type located at the first principal surface of the semiconductor substrate;
a second semiconductor region of the first conductivity type located at the second principal surface of the semiconductor substrate and having a higher impurity concentration than the first semiconductor region;
a third semiconductor region of a second conductivity type formed at the first principal surface of the first semiconductor region; and
a fourth semiconductor region of the first conductivity type formed in the first semiconductor region to be in contact with the third semiconductor region, and having a higher impurity concentration than the first semiconductor region,
wherein the third semiconductor region is the light receiving region, and
a bottom surface of the groove is constituted by the second semiconductor region.

4. The photodetecting device according to claim 1, further comprising:
an electrode pad disposed on the first principal surface and electrically connected to the through-electrode,
wherein, when viewed from a direction perpendicular to the first principal surface, the electrode pad is located in an area surrounded by the groove and spaced apart from the groove.

5. The photodetecting device according to claim 1, wherein, when viewed from a direction perpendicular to the first principal surface, an area surrounded by the groove has a polygonal shape, and the light receiving region has a polygonal shape.

6. The photodetecting device according to claim 1, wherein, when viewed from a direction perpendicular to the first principal surface, an opening of the through-hole has a circular shape, and an insulating layer is arranged on the inner peripheral surface of the through-hole.

7. The photodetecting device according to claim 1, wherein the plurality of avalanche photodiodes are arranged in a matrix, the through-hole is formed in each area surrounded by four mutually adjacent avalanche photodiodes of the plurality of avalanche photodiodes, the through-hole is provided with the through-electrode electrically connected to the light receiving region of one of the four mutually adjacent avalanche photodiodes, and the groove is formed in an area between the through-hole and the light receiving region of each of the four mutually adjacent avalanche photodiodes.

8. The photodetecting device according to claim 7, wherein, when viewed from a direction perpendicular to the first principal surface, the light receiving region has a polygonal shape, and when viewed from the direction perpendicular to the first principal surface, the groove extends along a side adjacent to the through-hole, of a plurality of sides of the light receiving region of each of the four avalanche photodiodes adjacent to the through-hole.

\* \* \* \* \*